US012633346B2

(12) United States Patent
Masaki

(10) Patent No.: US 12,633,346 B2
(45) Date of Patent: May 19, 2026

(54) SEMICONDUCTOR MEMORY DEVICE

(71) Applicant: Kioxia Corporation, Tokyo (JP)

(72) Inventor: Mitsunori Masaki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 379 days.

(21) Appl. No.: 18/337,115

(22) Filed: Jun. 19, 2023

(65) Prior Publication Data

US 2024/0079060 A1 Mar. 7, 2024

(30) Foreign Application Priority Data

Sep. 6, 2022 (JP) ................................. 2022-141743

(51) Int. Cl.
| | |
|---|---|
| *H10B 43/10* | (2023.01) |
| *G11C 5/06* | (2006.01) |
| *G11C 16/04* | (2006.01) |
| *H01L 23/528* | (2006.01) |
| *H10B 41/10* | (2023.01) |
| *H10B 41/27* | (2023.01) |
| *H10B 41/35* | (2023.01) |
| *H10B 43/27* | (2023.01) |
| *H10B 43/35* | (2023.01) |

(52) U.S. Cl.
CPC .......... *G11C 16/0483* (2013.01); *G11C 5/063* (2013.01); *H01L 23/5283* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search
None
See application file for complete search history.

(56) References Cited

U.S. PATENT DOCUMENTS

| | | | |
|---|---|---|---|
| 2020/0251488 A1 | 8/2020 | Iwai et al. | |
| 2020/0251489 A1 | 8/2020 | Tsutsumi et al. | |
| 2024/0064980 A1* | 2/2024 | Nishikawa | H10B 43/50 |
| 2024/0079060 A1* | 3/2024 | Masaki | H01L 23/5283 |

* cited by examiner

*Primary Examiner* — Jack S Chen
(74) *Attorney, Agent, or Firm* — Oblon, McClelland, Maier & Neustadt, L.L.P.

(57) ABSTRACT

A semiconductor memory device includes: wiring layers; a semiconductor column opposed to the wiring layers; a gate insulating film disposed between the wiring layers and the semiconductor column; and an insulating member in contact with the gate insulating film. A first wiring layer includes: a first wiring disposed on a gate insulating film side with respect to the insulating member; a second wiring disposed on a side opposite the first wiring; and a metal oxide film covering surfaces on one side and the other side in the stacking direction and not covering a contact surface with the insulating member of the second wiring. The second wiring includes a first conductive layer and a second conductive layer spaced apart in the stacking direction, and a first conductive portion connected to the first conductive layer and the second conductive layer. The first conductive portion includes the contact surface with the insulating member.

20 Claims, 24 Drawing Sheets

102

110A
101
110A
101
110A
101
110A
101
110A
101
110A
101
110A 101
110A
101
110A
101
110A
101
110A
101
110A
101
110A
101
110A
101

112E
112D
112C
112B
112A

101

SEMICONDUCTOR MEMORY DEVICE

CROSS-REFERENCE TO RELATED APPLICATIONS

This application is based upon and claims the benefit of Japanese Patent Application No. 2022-141743, filed on Sep. 6, 2022, the entire contents of which are incorporated herein by reference.

BACKGROUND

Field

Embodiments described herein relate generally to a semiconductor memory device.

Description of the Related Art

There has been known a semiconductor memory device that includes a plurality of wiring layers stacked in a stacking direction, a semiconductor column extending in the stacking direction and opposed to the plurality of wiring layers, and a gate insulating film disposed between the plurality of wiring layers and the semiconductor column. The gate insulating layer includes, for example, an electric charge accumulating film of silicon nitride (SiN) or the like.

DETAILED DESCRIPTION

Figure 1:
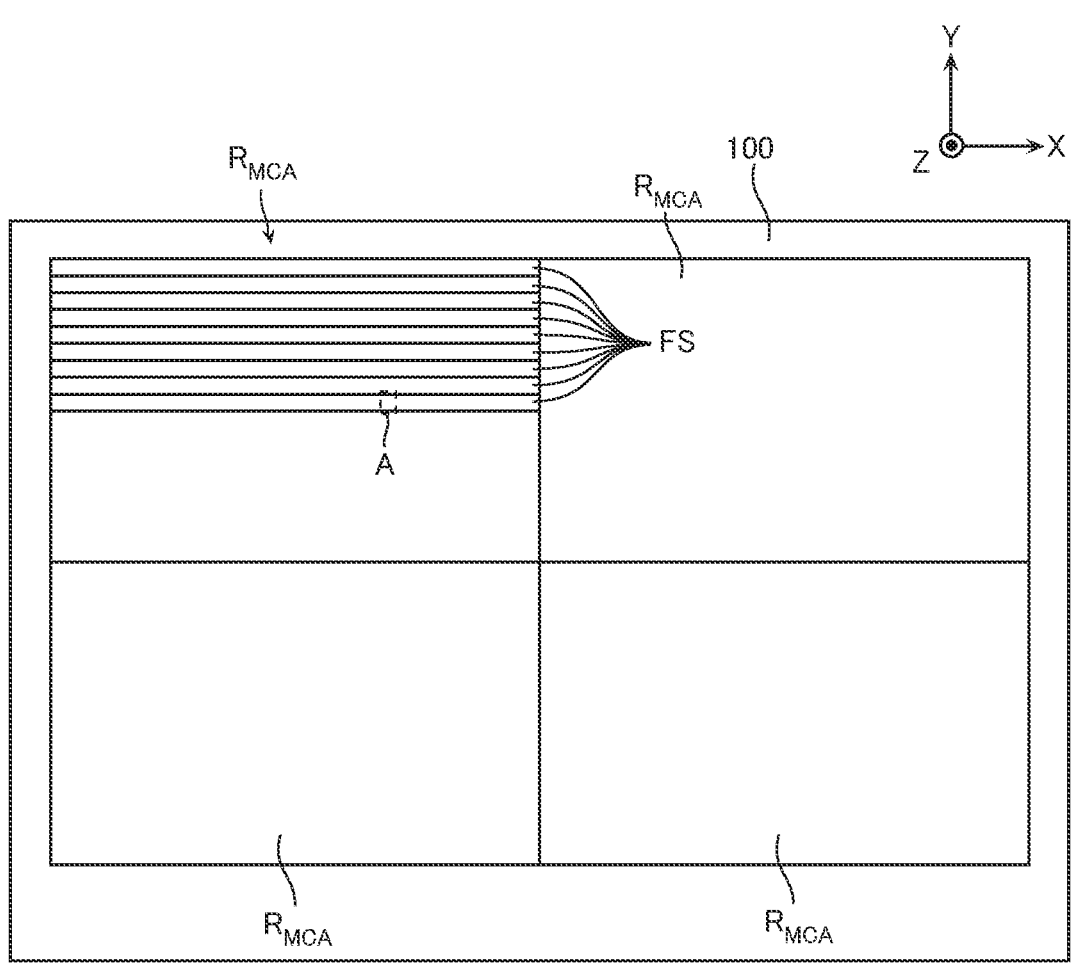
FIG. 1 is a schematic plan view illustrating a part of a configuration of a semiconductor memory device according to a first embodiment.

A semiconductor memory device according to one embodiment comprises: a plurality of wiring layers stacked in a stacking direction; a semiconductor column extending in the stacking direction and opposed to the plurality of wiring layers; a gate insulating film disposed between the plurality of wiring layers and the semiconductor column; and an insulating member extending in the stacking direction in a range in the stacking direction corresponding to a part of the plurality of wiring layers. The gate insulating film includes an electric charge accumulating film. The insulating member has a surface on one side in a first direction intersecting with the stacking direction in contact with the gate insulating film, and a surface on the other side in the first direction separated from the gate insulating film. A first wiring layer included in the part of the plurality of wiring layers includes: a first wiring disposed on a gate insulating film side in the first direction with respect to the insulating member and opposed to the semiconductor column via the gate insulating film; a second wiring disposed on a side opposite to the gate insulating film in the first direction with respect to the insulating member and in contact with the insulating member; a first metal oxide film covering a surface on one side and a surface on the other side in the stacking direction and an opposed surface to the semiconductor column of the first wiring; and a second metal oxide film covering a surface on one side and a surface on the other side in the stacking direction and not covering a contact surface with the insulating member of the second wiring. Compared with an end portion on an insulating member side in the first direction of the first metal oxide film included in the first wiring layer, an end portion on the insulating member side in the first direction of the electric charge accumulating film at a position in the stacking direction corresponding to the first metal oxide film has a larger distance in the first direction from the insulating member. The second wiring includes a first conductive layer and a second conductive layer spaced apart in the stacking direction, and a first conductive portion connected to end portions on the insulating member side in the first direction of the first conductive layer and the second conductive layer. The first conductive portion includes the contact surface with the insulating member continuously in the stacking direction.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

A "control circuit" in this specification may mean a peripheral circuit, such as a sequencer, disposed in a memory die, may mean a controller die, a controller chip, or the like connected to a memory die, and may mean a configuration including both of them.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction intersecting with a surface of the substrate may be referred to as a stacking direction. A direction along a predetermined plane intersecting with the stacking direction may be referred to as a first direction, and a direction intersecting with the first direction along this plane may be referred to as a second direction. The stacking direction may correspond to the Z-direction and need not correspond to the Z-direction. The first direction and the second direction may each correspond to any of the X-direction and the Y-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion on the substrate side of this configuration. An upper surface and an upper end of a certain configuration mean a surface and an end portion on a side opposite to the substrate of this configuration. A surface intersecting with the X-direction or the Y-direction is referred to as a side surface and the like.

In this specification, when referring to a "width", a "length", a "thickness", or the like of a configuration, a member, or the like in a predetermined direction, this may mean a width, a length, a thickness, or the like in a cross-sectional surface or the like observed with a Scanning electron microscopy (SEM), a Transmission electron microscopy (TEM), or the like.

First Embodiment

Figure 2:
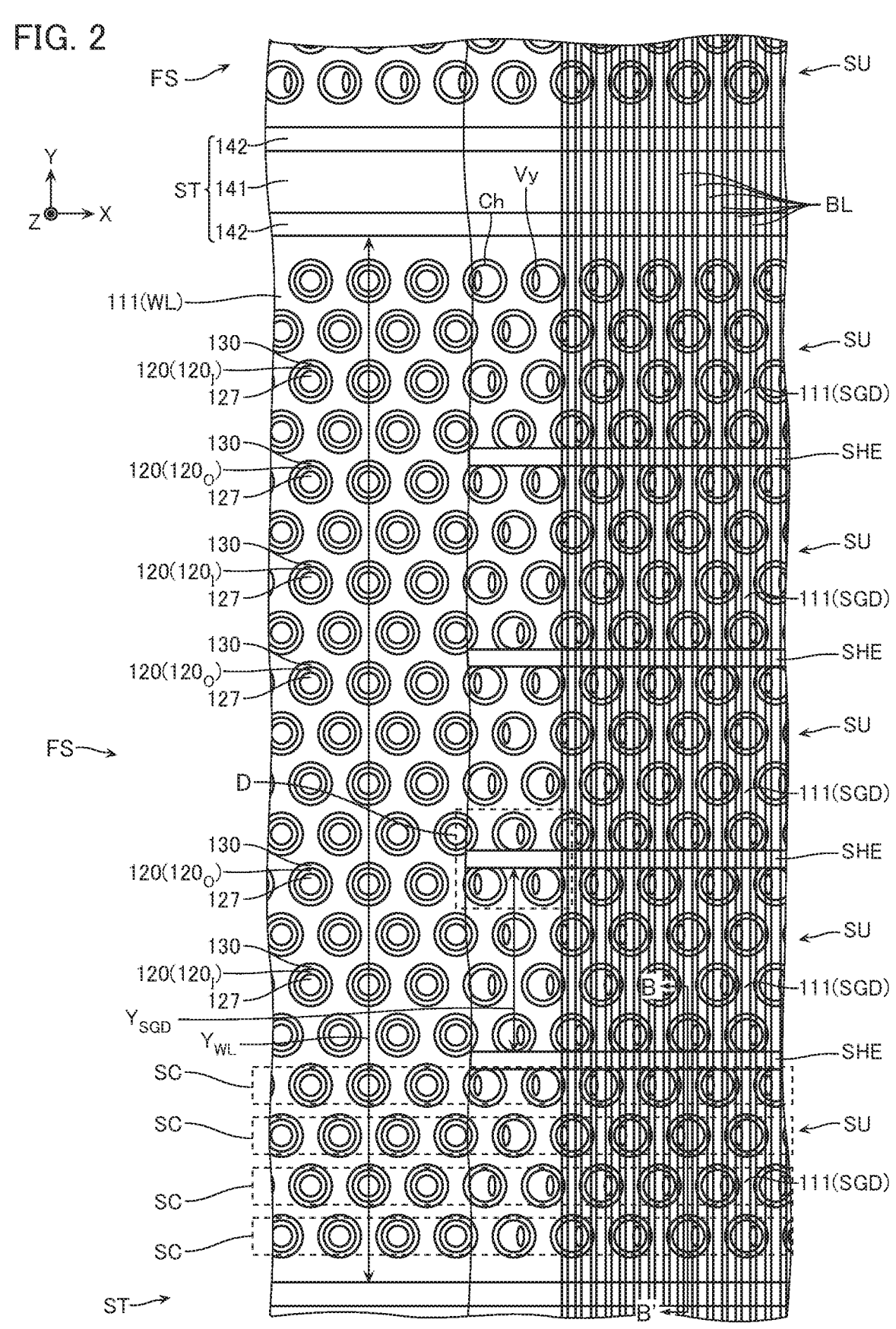
FIG. 2 is a schematic enlarged view of a part indicated by A in FIG. 1.
Figure 3:
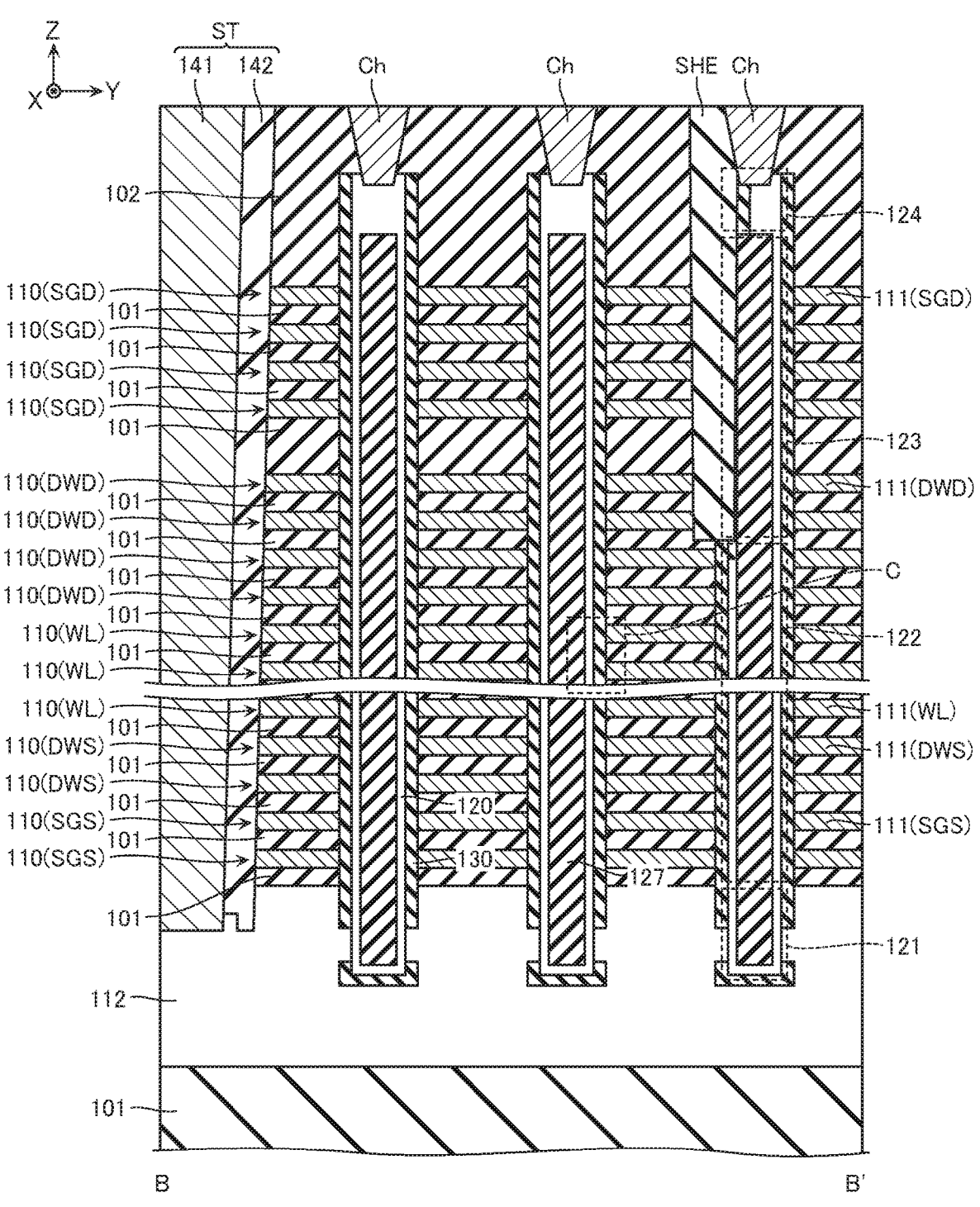
FIG. 3 is a schematic cross-sectional view of the structure illustrated in FIG. 2 taken along the line B-B' and viewed along the arrow direction.
Figure 4:
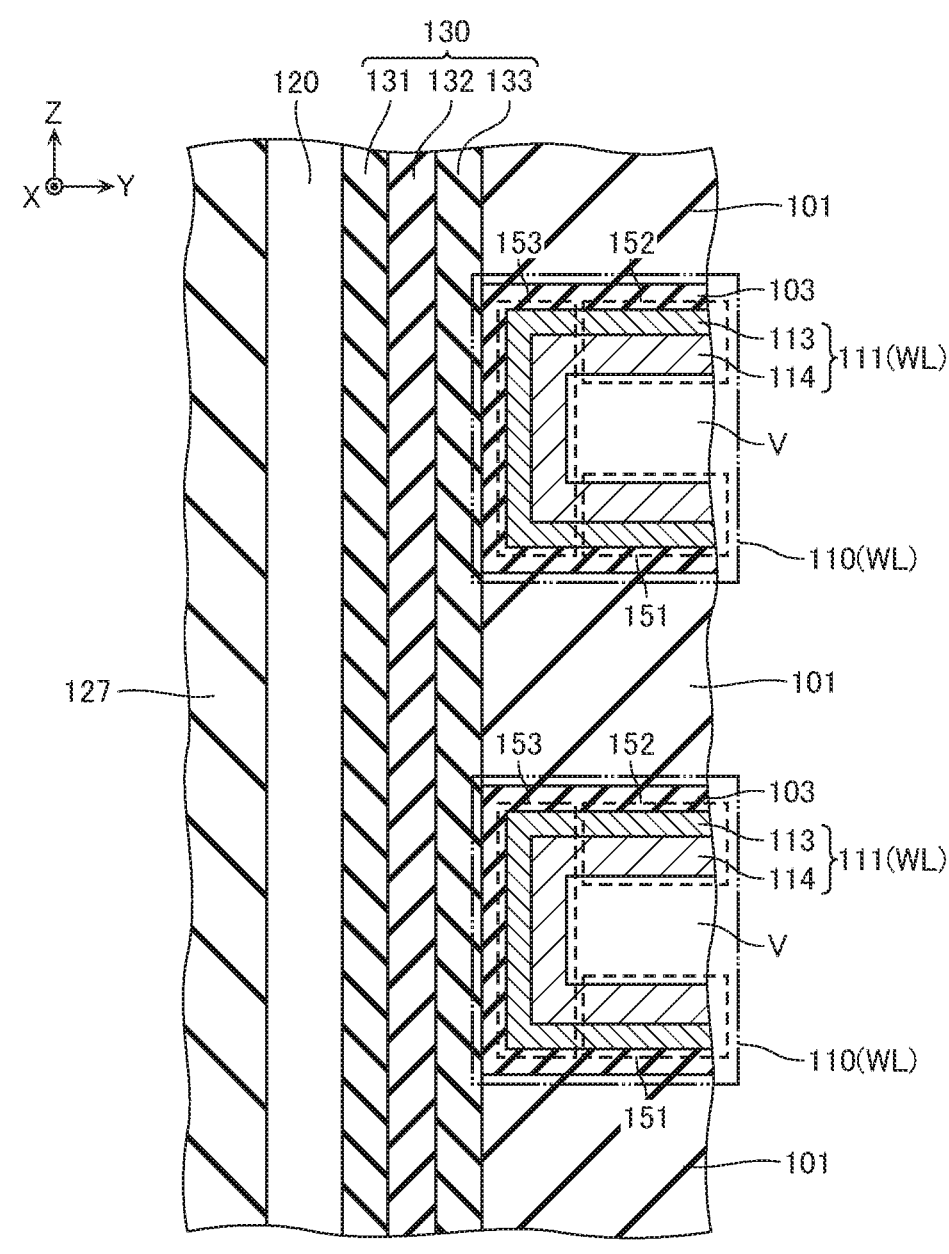
FIG. 4 is a schematic enlarged view of a part indicated by C in FIG. 3.
Figure 5:
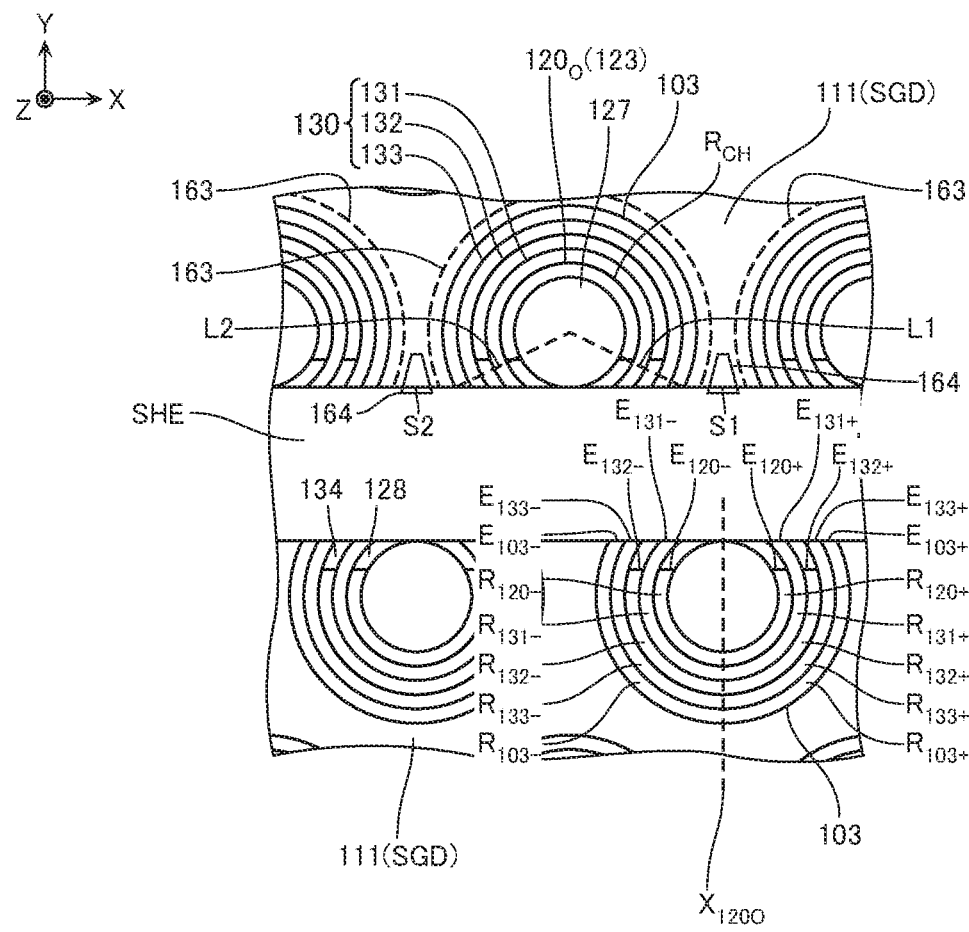
FIG. 5 is a schematic enlarged view of a part indicated by D in FIG. 2.
Figure 6:
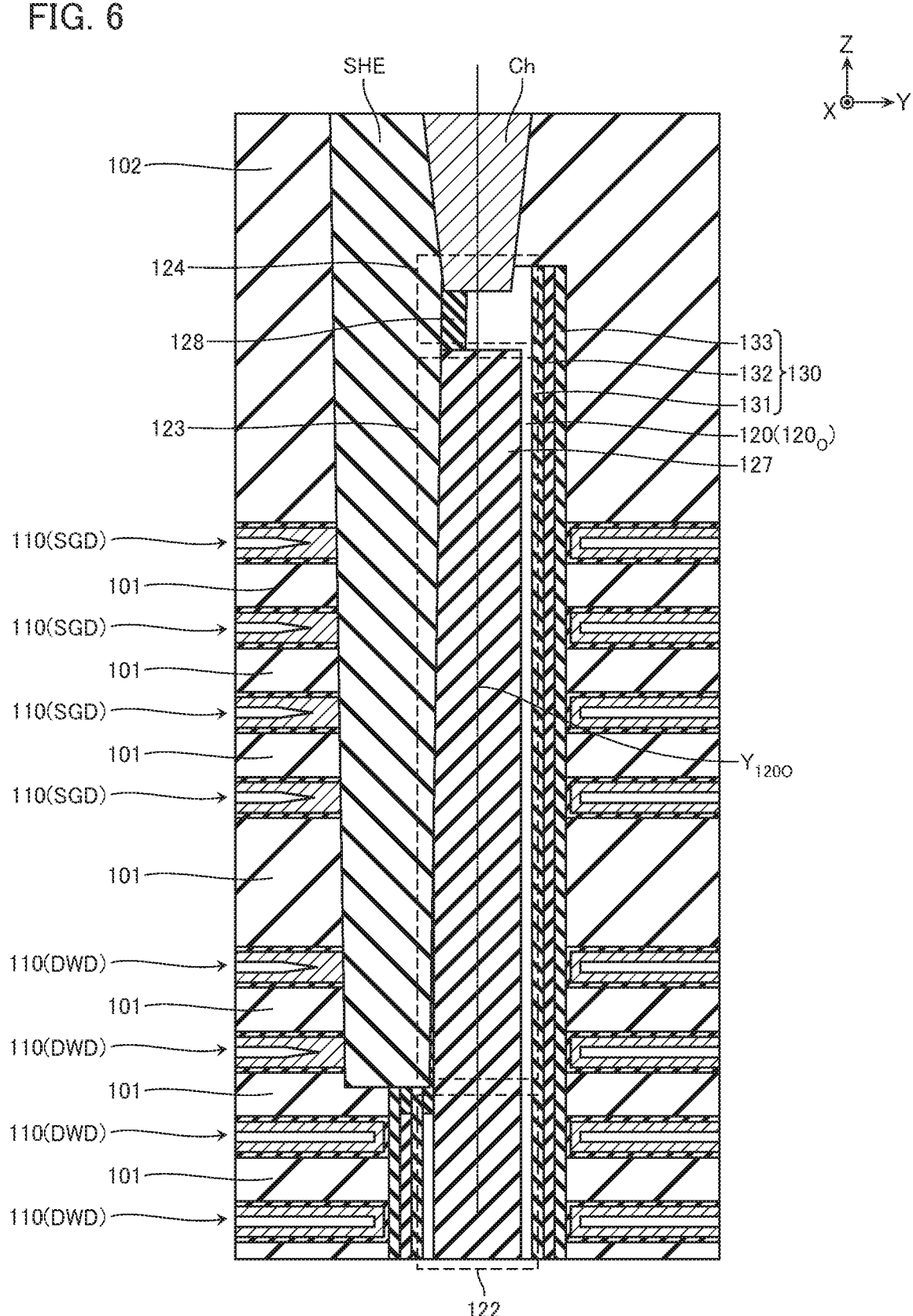
FIG. 6 is a schematic enlarged view illustrating a part of the configuration in FIG. 3.
Figure 7:
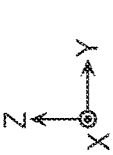
FIG. 7 is a schematic enlarged view illustrating a part of the configuration in FIG. 6.

Next, an exemplary configuration of a semiconductor memory device according to a first embodiment will be described with reference to FIG. 1 to FIG. 7. FIG. 1 is a schematic plan view illustrating a part of the configuration of the semiconductor memory device. FIG. 2 is a schematic enlarged view of a part indicated by A in FIG. 1. FIG. 3 is a schematic cross-sectional view of the structure illustrated in FIG. 2 taken along the line B-B' and viewed along the arrow direction. FIG. 4 is a schematic enlarged view of a part indicated by C in FIG. 3. While FIG. 4 illustrates a YZ cross-sectional surface, when a cross-sectional surface other than the YZ cross-sectional surface along the center axis of a semiconductor column 120 (for example, an XZ cross-sectional surface) is observed, a structure similar to that of FIG. 4 is also observed. FIG. 5 is a schematic enlarged view of a part indicated by D in FIG. 2. FIG. 6 is a schematic enlarged view illustrating a part of the configuration in FIG. 3. FIG. 7 is a schematic enlarged view illustrating a part of the configuration in FIG. 6.

Overall Configuration

As illustrated in FIG. 1, the semiconductor memory device according to this embodiment includes a semiconductor substrate 100. In the illustrated example, the semiconductor substrate 100 includes four memory cell array regions $R_{MCA}$ arranged in the X-direction and the Y-direction.

The memory cell array region $R_{MCA}$ includes a plurality of finger structures FS arranged in the Y-direction. As illustrated in FIG. 2, for example, the finger structure FS includes five string units SU arranged in the Y-direction. Between two finger structures FS mutually adjacent in the Y-direction, an inter-finger structure ST is disposed. Between two string units SU mutually adjacent in the Y-direction, an inter-string unit insulating member SHE of silicon oxide ($SiO_2$) or the like is disposed.

In this embodiment, one finger structure FS functions as one block of a NAND flash memory. However, the plurality of finger structures FS may function as one block. Moreover, the finger structure FS may include two to four of the string units SU or may include six or more of the string units SU.

As illustrated in FIG. 3, the finger structure FS includes a plurality of wiring layers 110 arranged in the Z-direction, a conductive layer 112 disposed below these plurality of wiring layers 110, and the plurality of semiconductor columns 120 extending in the Z-direction. In addition, between the plurality of wiring layers 110 and the plurality of semiconductor layers 120, respective gate insulating films 130 are disposed.

The plurality of wiring layers 110 each include a wiring 111. Between the plurality of wiring layers 110 arranged in the Z-direction, an insulating layer 101 of silicon oxide ($SiO_2$) or the like is disposed. On an upper surface of the wiring layer 110 in the uppermost layer, an insulating layer 102 of silicon oxide ($SiO_2$) or the like is disposed.

Wirings 111 in a plurality of wiring layers 110 function as word lines WL and gate electrodes of a plurality of memory cells (memory transistors) connected to the word lines WL of the NAND flash memory. In the following description, such wiring layer 110 and wiring 111 are referred to as a wiring layer 110 (WL) and a wiring 111 (WL) respectively, in some cases. The plurality of wirings 111 (WL) are each electrically independent for each finger structure FS. Side surfaces in a Y-direction positive side and a Y-direction negative side of the wiring 111 (WL) are electrically insulated from configurations in other finger structures FS via the inter-finger structure ST.

Wirings 111 in one or a plurality of wiring layers 110 positioned below the plurality of wiring layers 110 (WL) function as one or a plurality of dummy word lines DWS and gate electrodes of a plurality of dummy cells (dummy transistors) connected to the one or the plurality of dummy word lines DWS of the NAND flash memory. In the following description, such wiring layer 110 and wiring 111 are referred to as a wiring layer 110 (DWS) and a wiring 111 (DWS) respectively, in some cases. The wiring layer 110 (DWS) and the wiring 111 (DWS) are configured similarly to the wiring layer 110 (WL) and the wiring 111 (WL), respectively.

Wirings 111 in one or a plurality of wiring layers 110 positioned below the one or the plurality of wiring layers 110 (DWS) function as one or a plurality of select gate lines SGS and gate electrodes of a plurality of select transistors connected to one or a plurality of the select gate lines SGS of the NAND flash memory. In the following description, such wiring layer 110 and wiring 111 are referred to as a wiring layer 110 (SGS) and a wiring 111 (SGS) respectively, in some cases. The wiring layer 110 (SGS) and the wiring 111 (SGS) are configured similarly to the wiring layer 110 (WL) and the wiring 111 (WL), respectively.

Wirings 111 in one or a plurality of wiring layers 110 positioned above the plurality of wiring layers 110 (WL) function as one or a plurality of dummy word lines DWD and gate electrodes of a plurality of dummy cells connected to the one or the plurality of dummy word lines DWD of the NAND flash memory. In the following description, such wiring layer 110 and wiring 111 are referred to as a wiring layer 110 (DWD) and a wiring 111 (DWD) respectively, in some cases. A part of the wiring layers 110 (DWD) and a part of the wirings 111 (DWD) may be configured similarly to the wiring layer 110 (WL) and the wiring 111 (WL), respectively. The other part of the wiring layers 110 (DWD) and the other part of the wirings 111 (DWD) corresponding thereto disposed above the part of the wiring layers 110 (DWD) and the part of the wirings 111 (DWD) may be basically configured similarly to a wiring layer 110 (SGD) and a wiring 111 (SGD) described later, respectively. However, five wirings 111 (DWD) arranged in the Y-direction in such other part of the wiring layers 110 (DWD) are electrically connected with one another.

Wirings 111 in one or a plurality of wiring layers 110 positioned above the one or the plurality of wiring layers 110 (DWD) function as select gate lines SGD and gate electrodes of a plurality of select transistors connected to the select gate lines SGD of the NAND flash memory. In the following description, such wiring layer 110 and wiring 111 are referred to as a wiring layer 110 (SGD) and a wiring 111 (SGD) respectively, in some cases.

As illustrated in FIG. 2, the wiring layer 110 (SGD) includes five wirings 111 (SGD) arranged in the Y-direction via the inter-string unit insulating members SHE. A width $Y_{SGD}$ in the Y-direction of the wiring 111 (SGD) is smaller than a width $Y_{WL}$ in the Y-direction of the wiring 111 (WL). These five wirings 111 (SGD) are each electrically independent for each string unit SU. In each finger structure FS, wirings 111 (SGD) corresponding to the 1st and 5th string units SU counted from one side in the Y-direction (for example, the Y-direction negative side) are electrically insulated from the configurations in the other finger structures FS via the inter-finger structure ST disposed between the finger structures FS. Also, in each finger structure FS, two wirings 111 (SGD) mutually adjacent in the Y-direction are electrically insulated via the inter-string unit insulating member SHE.

The conductive layer 112 (FIG. 3) may contain, for example, polycrystalline silicon containing impurities, such as phosphorus (P) or boron (B). Also, on a lower surface of the conductive layer 112, for example, a metal, such as tungsten (W), a conductive layer of tungsten silicide or the like, or any other conductive layer may be disposed. Moreover, between the conductive layer 112 and the wiring layer 110, the insulating layer 101 of silicon oxide ($SiO_2$) or the like is disposed.

The conductive layer 112 functions as a source line of the NAND flash memory. The conductive layer 112 is, for example, disposed in common in every finger structure FS included in the memory cell array region $R_{MCA}$ (FIG. 1).

As illustrated in FIG. 2, for example, the semiconductor columns 120 are arranged in a predetermined pattern in the X-direction and the Y-direction. For example, the finger structure FS includes 20 semiconductor column rows SC disposed from one side in the Y-direction to the other side in the Y-direction. These respective 20 semiconductor column rows SC include the plurality of semiconductor columns 120 arranged in the X-direction.

Hereinafter, the semiconductor columns 120 corresponding to the 4n (n is an integer of 1 or more and 4 or less)-th and 4n+1-th semiconductor column rows SC counted from one side in the Y-direction are referred to as a semiconductor column $120_o$ in some cases. Also, the semiconductor columns 120 corresponding to the 1st, 2nd, 3rd, 4n+2-th, 4n+3-th and 20th semiconductor column rows SC counted from one side in the Y-direction are referred to as a semiconductor column 120, in some cases.

The semiconductor column 120 contains, for example, polycrystalline silicon (Si). As illustrated in FIG. 3, for example, the semiconductor column 120 has an approximately cylindrical shape, and its center part is provided with an insulating column 127 of silicon oxide ($SiO_2$) or the like.

The semiconductor column 120 includes: a region 121 disposed below a lower surface of the wiring layer 110 in the lowermost layer; a region 122 disposed above the region 121 and disposed below a lower end of the inter-string unit insulating member SHE; a region 123 disposed above the region 122 and disposed below an upper end of the insulating column 127; and a region 124 disposed above the region 123.

The region 121 contains N-type impurities, such as phosphorus (P). The region 121 has an approximately cylindrical shape. The region 121 is connected to the conductive layer 112.

The region 122 is opposed to the plurality of wirings 111 (SGS), 111 (DWS), 111 (WL) and a part of the wirings 111 (DWD). The region 122 functions as channel regions of the memory cells, channel regions of the dummy cells, and channel regions of the select transistors of the NAND flash memory. The region 122 need not contain N-type impurities, such as phosphorus (P). The region 122 has an approximately cylindrical shape.

The region 123 is opposed to the other part of the wirings 111 (DWD) and the plurality of wirings 111 (SGD). The region 123 functions as a channel region of the dummy cell and a channel region of the select transistor. The region 123 need not contain N-type impurities, such as phosphorus (P).

Here, the region 123 of the semiconductor column 1201 has an approximately cylindrical shape. On the other hand, as illustrated in FIG. 5, for example, the region 123 of the semiconductor column 120$_o$ has a shape in which a part of cylinder is missing (arc-like shape in an XY cross-sectional surface).

FIG. 5 illustrates a region $R_{120+}$ disposed on an X-direction positive side with respect to a center position $X_{120o}$ in the X-direction and a region $R_{120-}$ disposed on an X-direction negative side with respect to the center position $X_{120o}$ in the X-direction of the semiconductor column 120$o$. Note that, as the center position $X_{120o}$ in the X-direction of the semiconductor column 120$o$, for example, a circumscribed circle of the semiconductor column 120$o$ on an XY cross-sectional surface as illustrated in FIG. 5 may be specified, and the center position $X_{120o}$ may be specified as a position in the X-direction of the center of this circumscribed circle. Also, a center of gravity on an image of the semiconductor column 120$o$ on the XY cross-sectional surface as illustrated in FIG. 5 may be specified, and the center position $X_{120o}$ may be specified as a position in the X-direction of this center of gravity on the image.

End portions on a side opposite to the inter-string unit insulating member SHE in the Y-direction of the regions $R_{120+}$, $R_{120-}$ are continuous along the circumscribed circle of the semiconductor column 120$_o$. In an outer peripheral surface of the semiconductor column 120$_o$, a part disposed along the circumscribed circle of the semiconductor column 120$_o$ is opposed to the wirings 111 (DWD), and 111 (SGD). Hereinafter, such region is referred to as a region $R_{CH}$ in some cases.

End portions $E_{120+}$, $E_{120-}$ of an inter-string unit insulating member SHE side in the Y-direction of the regions $R_{120+}$, $R_{120-}$ are separated in the X-direction from one another. Also, these end portions $E_{120+}$, $E_{120-}$ are separated from the inter-string unit insulating member SHE. Between these end portions $E_{120+}$, $E_{120-}$ and the inter-string unit insulating member SHE, insulating members 128 of silicon oxide (SiO$_2$) or the like are disposed. The insulating members 128 extend in the Z-direction along an opposed surface to the inter-string unit insulating member SHE of the semiconductor column 120$_o$.

The region 124 (FIG. 3) contains N-type impurities, such as phosphorus (P). The region 124 is electrically connected to bit lines BL extending in the Y-direction via a via-contact electrode Ch and a via-contact electrode Vy (FIG. 2) extending in the Z-direction. The via-contact electrode Ch and the via-contact electrode V$_y$ may include, for example, a stacked film of a barrier conductive film of titanium nitride (TiN) or the like and a metal film of tungsten (W) or the like. The bit line BL may include, for example, a stacked film of a barrier conductive film of titanium nitride (TiN) or the like and a metal film of copper (Cu) or the like.

The region 124 of the semiconductor column 120, has an approximately columnar shape. On the other hand, the region 124 of the semiconductor column 120$_o$ has a shape in which a part of cylinder is missing. As illustrated in FIG. 6, between the region 124 of the semiconductor column 120$_o$ and the inter-string unit insulating member SHE, a part of the insulating member 128 described with reference to FIG. 5 is disposed.

As illustrated in FIG. 4, for example, the gate insulating film 130 includes a tunnel insulating film 131, an electric charge accumulating film 132, and a block insulating film 133 stacked between the semiconductor column 120 and the wiring layers 110. The tunnel insulating film 131 and the block insulating film 133 contain, for example, silicon oxide (SiO$_2$). The electric charge accumulating film 132 is, for example, a film of silicon nitride (SiN) or the like that can accumulate electric charge.

In the gate insulating film 130, a part disposed at a position corresponding to the region 121 of the semiconductor column 120 has an approximately cylindrical shape, as illustrated in FIG. 3, for example, and extends in the Z-direction along an outer peripheral surface of the semiconductor column 120 excluding a contact portion between the semiconductor column 120 and the conductive layer 112.

In the gate insulating film 130, a part disposed at a position corresponding to the region 122 of the semiconductor column 120 has an approximately cylindrical shape and extends in the Z-direction along the outer peripheral surface of the semiconductor column 120.

In the gate insulating film 130, a part disposed at a position corresponding to the region 123 of the semiconductor column 1201 has an approximately cylindrical shape and extends in the Z-direction along an outer peripheral surface of the semiconductor column 1201.

In the gate insulating film 130, a part disposed at a position corresponding to the region 123 of the semiconductor column 120$_o$ has a shape in which a part of cylinder is missing (arc-like shape in an XY cross-sectional surface) as illustrated in FIG. 5, for example.

FIG. 5 illustrates regions $R_{131+}$, $R_{132+}$, $R_{133+}$ disposed in the X-direction positive side with respect to the center position $X_{120o}$ and regions $R_{131-}$, $R_{132-}$, $R_{133-}$ disposed in the X-direction negative side with respect to the center position $X_{120o}$ in the X-direction of the semiconductor column 120$_o$ of the tunnel insulating film 131, the electric charge accumulating film 132, and the block insulating film 133 disposed in a position corresponding to the region 123 of the semiconductor column 120$o$.

End portions on a side opposite to the inter-string unit insulating member SHE in the Y-direction of the regions $R_{131+}$, $R_{131-}$ are continuous along a circumscribed circle of the tunnel insulating film 131. Similarly, end portions on a side opposite to the inter-string unit insulating member SHE in the Y-direction of the regions $R_{132+}$, $R_{132-}$ are continuous along a circumscribed circle of the electric charge accumulating film 132. In addition, end portions on a side opposite to the inter-string unit insulating member SHE in the Y-direction of the regions $R_{133+}$, $R_{133-}$ are continuous along a circumscribed circle of the block insulating film 133.

End portions $E_{131+}$, $E_{131-}$ at the inter-string unit insulating member SHE side in the Y-direction of the regions $R_{131+}$, $R_{131-}$ are separated in the X-direction from one another. Similarly, end portions $E_{132+}$, $E_{132-}$ on the inter-string unit insulating member SHE side in the Y-direction of the regions $R_{132+}$, $R_{132-}$ are also separated in the X-direction from one another. In addition, end portions $E_{133+}$, $E_{133-}$ on the inter-string unit insulating member SHE side in the Y-direction of the regions $R_{133+}$, $R_{133-}$ are also separated in the X-direction from one another.

The end portions $E_{131+}$, $E_{131-}$ and the end portions $E_{133+}$, $E_{133-}$ are in contact with the inter-string unit insulating member SHE. On the other hand, the end portions $E_{132+}$, $E_{132-}$ are separated from the inter-string unit insulating member SHE. Between these end portions $E_{132+}$, $E_{132-}$ and the inter-string unit insulating member SHE, insulating members 134 of silicon oxide (SiO$_2$) or the like are disposed.

Note that FIG. 5 illustrates contact surfaces S1, S2 between the wiring 111 (SGD) and the inter-string unit insulating member SHE. The contact surfaces S1, S2 are positioned mutually adjacently via one semiconductor column $120_o$ in the X-direction, and is connected to an opposed surface to this one semiconductor column $120_o$ of the wiring 111 (SGD). The contact surface S1 is disposed in the X-direction positive side with respect to the contact surface S2. The contact surface S2 is disposed in the X-direction negative side with respect to the contact surface S1.

FIG. 5 illustrates an imaginary line L1 that connects the center of the circumscribed circle of one semiconductor column $120_o$ positioned between the contact surfaces S1, S2, and an end portion on the X-direction negative side of the contact surface S1. Also, an imaginary line L2 that connects the center of the circumscribed circle of this one semiconductor column $120_o$ and an end portion on the X-direction positive side of the contact surface S2 is illustrated. In the illustrated example, the above-described end portions $E_{132+}$, $E_{132-}$ are disposed on a side opposite to the inter-string unit insulating member SHE with respect to the imaginary lines L1, L2.

As illustrated in FIG. 2 and FIG. 3, for example, the inter-finger structure ST includes an inter-finger electrode 141 extending in the X-direction and the Z-direction, and inter-finger insulating members 142 of silicon oxide ($SiO_2$) or the like disposed at side surfaces in the Y-direction of the inter-finger electrode 141. A lower end of the inter-finger electrode 141 is connected to the conductive layer 112. Also, an upper end of the inter-finger electrode 141 is positioned above the upper surface of the wiring layer 110 positioned in the uppermost layer. The inter-finger electrode 141 may include, for example, a stacked film of a barrier conductive film of titanium nitride (TiN) or the like and a metal film of tungsten (W) or the like. Also, the inter-finger electrode 141 may contain, for example, a polycrystalline silicon containing impurities, such as phosphorus (P) or boron (B). The inter-finger electrode 141 functions as, for example, a part of the source line of the NAND flash memory.

The inter-string unit insulating member SHE contains, for example, silicon oxide ($SiO_2$). As illustrated in FIG. 2, for example, the inter-string unit insulating member SHE is disposed between every 4n-th semiconductor column row SC and 4n+1-th semiconductor column row SC counted from one side in the Y-direction, and extends in the X-direction. Respective side surfaces in the Y-direction of the inter-string unit insulating member SHE are in contact with either one of the gate insulating films 130 corresponding to the 4n-th semiconductor column row SC and the gate insulating films 130 corresponding to the 4n+1-th semiconductor column row SC counted from one side in the Y-direction, and are separated from the other.

Note that, in a cross-sectional surface as illustrated in FIG. 5, in a structure in which the tunnel insulating film 131, the insulating member 134, the block insulating film 133, and the inter-string unit insulating member SHE all contain silicon oxide ($SiO_2$) or the like, a boundary surface between the gate insulating film 130 and the inter-string unit insulating member SHE cannot be observed in some cases. However, for example, in the case where a straight line connecting the end portion on the X-direction negative side of the contact surface S1 and the end portion on the X-direction positive side of the contact surface S2 intersects with the circumscribed circle of the gate insulating film 130, the inter-string unit insulating member SHE is considered to be in contact with the gate insulating film 130.

As illustrated in FIG. 3, the inter-string unit insulating member SHE extends in the Z-direction within a height range corresponding to the insulating layer 102, the plurality of wiring layers 110 (SGD), the part of the wiring layers 110 (DWD), and the insulating layers 101 disposed on upper and lower surfaces of the wiring layers 110, and separates these configurations in the Y-direction. A lower end of the inter-string unit insulating member SHE is positioned between an upper surface of the wiring layer 110 (DWD) in the upper-most layer and a lower surface of the wiring layer 110 (DWD) in the lowermost layer.

In the example of FIG. 6, a side surface in the Y-direction of the inter-string unit insulating member SHE does not reach a center position $Y_{120o}$ in the Y-direction of the semiconductor column $120_o$. That is, when focusing on one semiconductor column 1200, the inter-string unit insulating member SHE closest to this semiconductor column $120_o$ is disposed on one side in the Y-direction (Y-direction negative side in the example of FIG. 6) with respect to the center position $Y_{120o}$ of this semiconductor column $120_o$. Note that the center position $Y_{120o}$ of the semiconductor column $120_o$ can be specified, for example, at a height position below the lower end of the inter-string unit insulating member SHE in a cross-sectional surface as illustrated in FIG. 6.

In the illustrated example, viewed from the Z-direction, the inter-string unit insulating member SHE is disposed in a position overlapping with a part of the semiconductor column $120_o$, and parts of the tunnel insulating film 131, the electric charge accumulating film 132, and the block insulating film 133 constituting the gate insulating film 130.

Configuration of Wiring Layer 110 (WL)

As illustrated in FIG. 4, for example, the wiring layer 110 (WL) includes the wiring 111 (WL) and a metal oxide film 103 covering the upper and lower surfaces of the wiring 111 (WL) and an opposed surface to the semiconductor column 120 of the wiring 111 (WL).

The wiring 111 (WL) includes conductive layers 151, 152 separated in the Z-direction and a conductive portion 153 disposed corresponding to the semiconductor column 120. In the illustrated example, a void V is provided between the conductive layers 151, 152.

Also, the wiring 111 (WL) includes a barrier conductive film 113 disposed on a surface on a void V side of the metal oxide film 103 and a metal film 114 disposed on a surface on the void V side of the barrier conductive film 113. The barrier conductive film 113 may include, for example, titanium nitride (TiN), tantalum nitride (TaN), or a stacked film containing at least one of these. The metal film 114 may include, for example, tungsten (W), molybdenum (Mo), ruthenium (Ru), or a stacked film containing at least one of these.

The conductive layer 151 is formed in an approximately plate shape extending in the X-direction and the Y-direction. A lower surface of the conductive layer 151 corresponds to the lower surface of the wiring 111 (WL). The conductive layer 151 includes a part of the barrier conductive film 113 and a part of the metal film 114 disposed on an upper surface thereof.

The conductive layer 152 is formed in an approximately plate shape extending in the X-direction and the Y-direction. An upper surface of the conductive layer 152 corresponds to an upper surface of the wiring 111 (WL). The conductive layer 152 includes a part of the barrier conductive film 113 and a part of the metal film 114 disposed on a lower surface thereof.

The conductive portion 153 is formed in an approximately cylindrical shape along the outer peripheral surface of the semiconductor column 120. An inner peripheral surface of the conductive portion 153 corresponds to the opposed surface to the semiconductor column 120 of the wiring 111

(WL). This opposed surface is continuous in the Z-direction from the upper surface to the lower surface of the wiring 111 (WL). A lower end portion of the conductive portion 153 is continuous with the conductive layer 151. An upper end portion of the conductive portion 153 is continuous with the conductive layer 152. The conductive portion 153 includes a part formed in an approximately cylindrical shape of the barrier conductive film 113 and a part of the metal film 114 disposed in an outer peripheral surface thereof.

The metal oxide film 103 functions as a high-dielectric-constant insulating film. The metal oxide film 103 may include, for example, aluminum oxide (AlO), hafnium oxide (HfO), zirconium oxide (ZrO), or a stacked film containing at least one of these.

Parts of the metal oxide film 103 covering the upper and lower surfaces of the wiring 111 (WL) are formed in an approximately plate shape extending in the X-direction and Y-direction. A part of the metal oxide film 103 covering the opposed surface to the semiconductor column 120 of the wiring 111 (WL) is formed in an approximately cylindrical shape.

Configuration of Wiring Layer 110 (SGD)

As illustrated in FIG. 7, for example, the wiring layer 110 (SGD) includes the wiring 111 (SGD) and the metal oxide film 103 covering upper and lower surfaces of the wiring 111 (SGD) and the opposed surface to the semiconductor column 120 of the wiring 111 (SGD). The metal oxide film 103 in the wiring layer 110 (SGD) does not cover the contact surface with the inter-string unit insulating member SHE of the wiring 111 (SGD).

The wiring 111 (SGD) includes conductive layers 161, 162 separated in the Z-direction, conductive portions 163 disposed corresponding to the semiconductor columns 120, and conductive portions 164 disposed corresponding to the inter-string unit insulating member SHE. In the illustrated example, the void V is provided between the conductive layers 161, 162.

In addition, the wiring 111 (SGD) includes: a barrier conductive film 115 disposed on a surface on the void V side of the metal oxide film 103; a metal film 116 disposed on a surface on the void V side of the barrier conductive film 115; a barrier conductive film 117 disposed on a surface on the void V side of the metal film 116; and a metal film 118 disposed on a surface different from an exposed surface to the void V of the barrier conductive film 117. The barrier conductive films 115, 117 may include, for example, titanium nitride (TiN), tantalum nitride (TaN), or a stacked film containing at least one of these. The metal films 116, 118 may include, for example, tungsten (W), molybdenum (Mo), ruthenium (Ru), or a stacked film containing at least one of these.

The conductive layer 161 is formed in an approximately plate shape extending in the X-direction and Y-direction. A lower surface of the conductive layer 161 corresponds to the lower surface of the wiring 111 (SGD). The conductive layer 161 includes a part of the barrier conductive film 115, a part of the metal film 116 disposed on an upper surface of the barrier conductive film 115, and a part of the barrier conductive film 117 disposed on an upper surface of the metal film 116.

The conductive layer 162 is formed in an approximately plate shape extending in the X-direction and the Y-direction. An upper surface of the conductive layer 162 corresponds to an upper surface of the wiring 111 (SGD). The conductive layer 162 includes a part of the barrier conductive film 115, a part of the metal film 116 disposed on a lower surface of the barrier conductive film 115, and a part of the barrier conductive film 117 disposed on a lower surface of the metal film 116.

Conductive portions 163 corresponding to the semiconductor column $120_I$ are formed in an approximately cylindrical shape along the outer peripheral surface of the semiconductor column 1201. An inner peripheral surface of the conductive portion 163 corresponds to an opposed surface to the semiconductor column $120_I$ of the wiring 111 (SGD). This opposed surface is continuous in the Z-direction from the upper surface to the lower surface of the wiring 111 (SGD). A lower end portion of the conductive portion 163 is continuous with the conductive layer 161. An upper end portion of the conductive portion 163 is continuous with the conductive layer 162. The conductive portion 163 includes a part formed in an approximately cylindrical shape of the barrier conductive film 115, a part of the metal film 116 disposed on an outer peripheral surface of the barrier conductive film 115, and a part of the barrier conductive film 117 disposed on an outer peripheral surface of the metal film 116.

Conductive portions 163 corresponding to the semiconductor columns $120_o$ and the conductive portions 164 are, as illustrated in FIG. 5, alternately arranged in the X-direction along the side surface in the Y-direction of the inter-string unit insulating member SHE.

The conductive portions 163 corresponding to the semiconductor column $120_o$ are basically configured similarly to the conductive portion 163 corresponding to the semiconductor column 1201. However, the conductive portion 163 corresponding to the semiconductor column $120_o$ is formed in an approximately cylindrical shape that is partially missing (arc-like shape in an XY cross-sectional surface) along the outer peripheral surface of the semiconductor column $120_o$. Also, the conductive portion 163 is in contact with the inter-string unit insulating member SHE. The conductive portion 163 has contact surfaces in contact with the inter-string unit insulating member SHE corresponding to the contact surfaces in contact with the inter-string unit insulating member SHE of the wiring 111 (SGD).

As illustrated in FIG. 7, the conductive portion 164 is connected to end portions in the Y-direction of the conductive layer 161, 162, and is in contact with the inter-string unit insulating member SHE. The conductive portion 164 has a contact surface with the inter-string unit insulating member SHE corresponding to the contact surface with the inter-string unit insulating member SHE of the wiring 111 (SGD). This contact surface is continuous in the Z-direction from the upper surface to the lower surface of the wiring 111 (SGD). As illustrated in FIG. 7, the conductive portion 164 includes: a part of the barrier conductive film 115; a part of the metal film 116 disposed on an upper surface of the barrier conductive film 115; a part of the barrier conductive film 117 disposed on an upper surface of the metal film 116; the metal film 118 disposed on an upper surface of the barrier conductive film 117; a part of the barrier conductive film 117 disposed on an upper surface of the metal film 118; a part of the metal film 116 disposed on an upper surface of the barrier conductive film 117; and a part of the barrier conductive film 115 disposed on an upper surface of the metal film 116. In the illustrated example, these films are all in contact with the inter-string unit insulating member SHE.

Note that the thickness of the barrier conductive film 115 (FIG. 7) approximately matches the thickness of the barrier conductive film 113 (FIG. 4). Also, the thickness of the metal film 116 (FIG. 7) approximately matches the thickness of the metal film 114 (FIG. 4). Therefore, the thicknesses (lengths in the Z-direction) of the conductive layers 161, 162 (FIG. 7) and the thickness (length in a diameter direction from an inner peripheral surface to an outer peripheral surface) of the conductive portion 163 (FIG. 7) are larger than the thicknesses (lengths in the Z-direction) of the conductive layers 151, 152 (FIG. 4) and the thickness (length in the diameter direction from an inner peripheral surface to an outer peripheral surface) of the conductive portion 153 (FIG. 4) by the thickness of the barrier conductive film 117. Also, in the example of FIG. 7, a length (length in the Y-direction from the contact surface with the inter-string unit insulating member SHE of the conductive portion 164 to the void V) of the conductive portion 164 is larger than the thickness of the conductive layers 161, 162 and the thickness of the conductive portion 163.

Parts of the metal oxide film 103 covering the upper and lower surfaces of the wiring 111 (SGD) are formed in an approximately plate shape extending in the X-direction and Y-direction. A part of the metal oxide film 103 covering the opposed surface to the semiconductor column 1201 of the wiring 111 (SGD) is formed in an approximately cylindrical shape. A part of the metal oxide film 103 covering an opposed surface to the semiconductor column 120$_o$ of the wiring 111 (SGD) has a shape in which a part of cylinder is missing (arc-like shape in an XY cross-sectional surface) as illustrated in FIG. 5, for example.

FIG. 5 illustrates a region $R_{10}3+$ disposed on the X-direction positive side with respect to the center position $X_{1200}$ in the X-direction of the semiconductor column 120$_o$ and the region $R_{103-}$ disposed on the X-direction negative side with respect to the center position $X_{1200}$ of the part of the metal oxide film 103 covering the opposed surface to the semiconductor column 120$_o$ of the wiring 111 (SGD).

End portions on a side opposite to the inter-string unit insulating member SHE in the Y-direction of the regions $R_{103+}$, $R_{103-}$ are continuous along a circumscribed circle of the metal oxide film 103. End portions $E_{103+}$, $E_{103-}$ on the inter-string unit insulating member SHE side in the Y-direction of the regions $R_{103+}$, $R_{103-}$ are separated in the X-direction from one another. The end portions $E_{103+}$, $E_{103-}$ are in contact with the inter-string unit insulating member SHE.

Manufacturing Method

Figure 23:
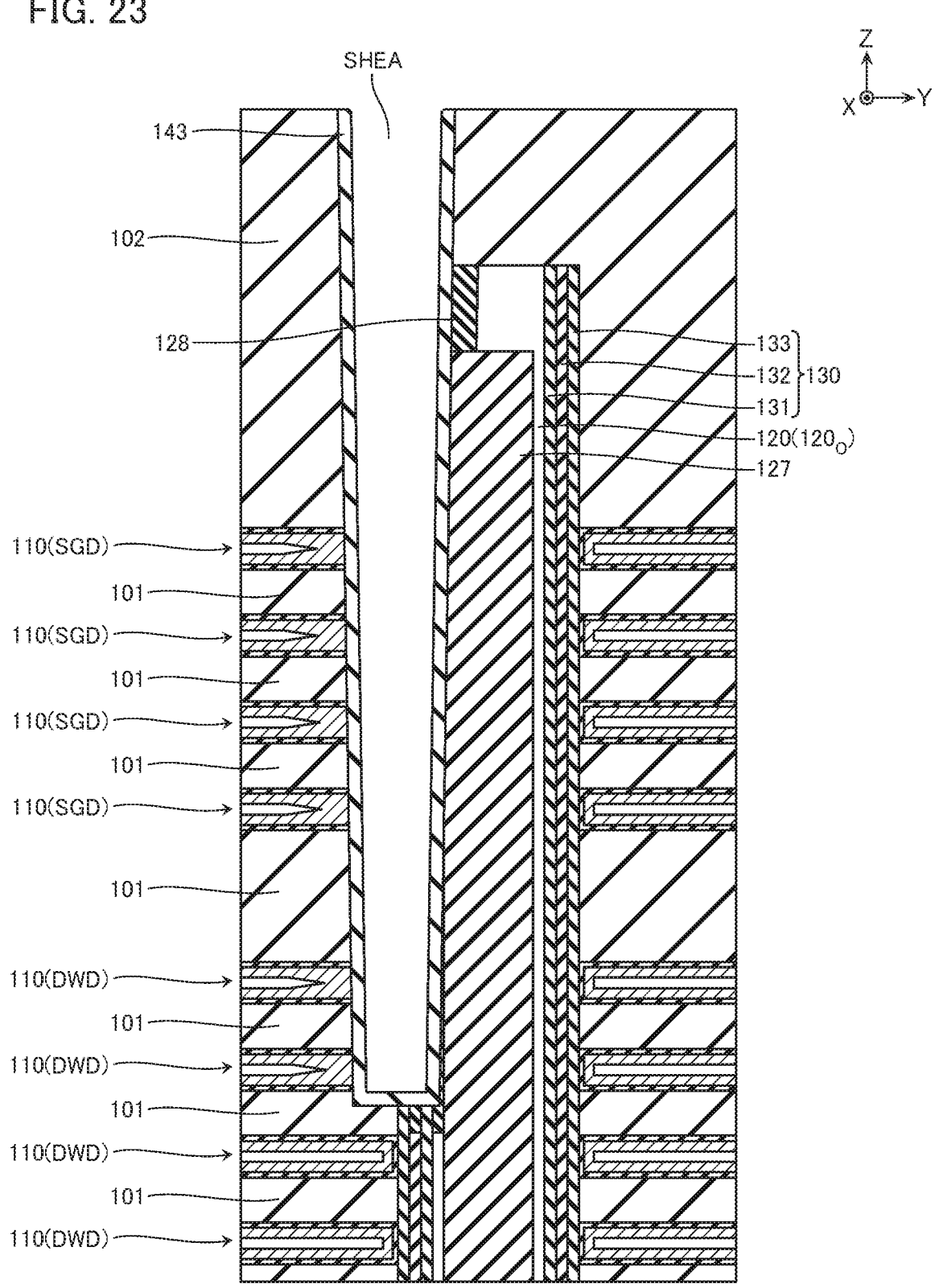
FIG. 23 is a schematic cross-sectional view for describing the manufacturing method.
Figure 24:
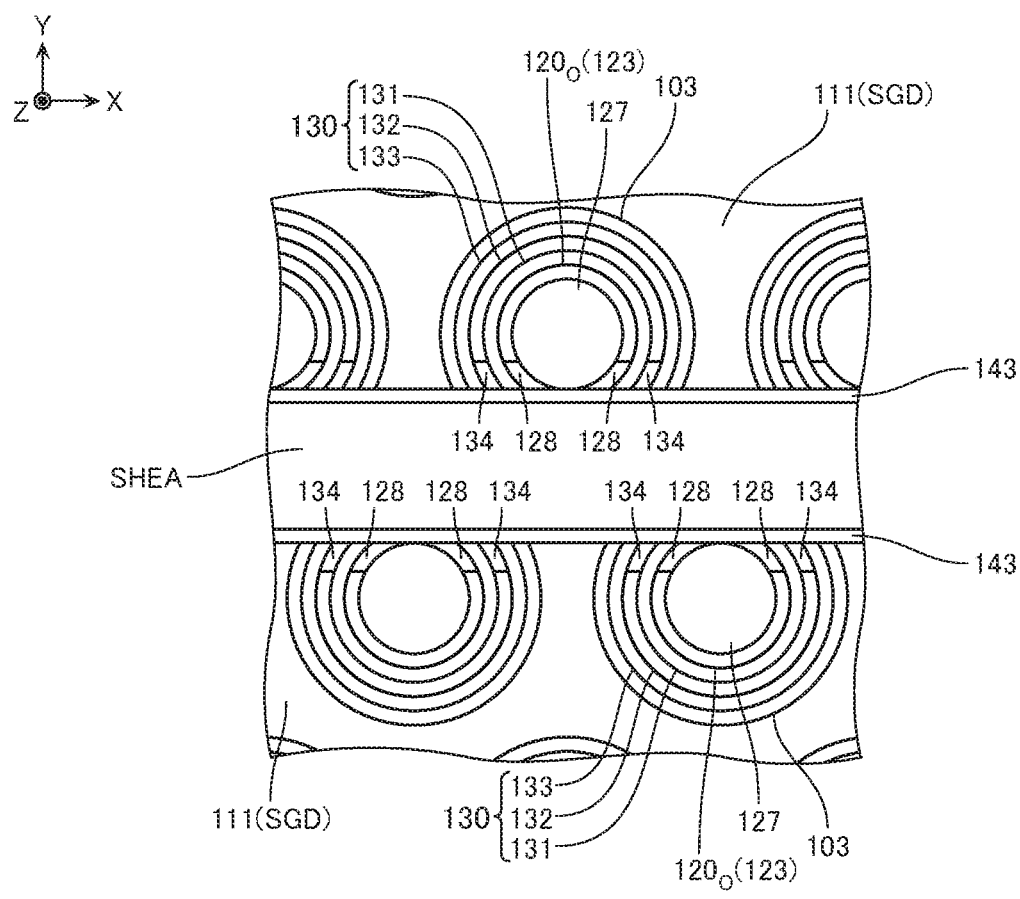
FIG. 24 is a schematic plan view for describing the manufacturing method.

Next, a manufacturing method of the semiconductor memory device according to the first embodiment will be described with reference to FIG. 8 to FIG. 24. FIG. 8 to FIG. 14, FIG. 16 and FIG. 17 are schematic cross-sectional views for describing the manufacturing method, and illustrate a cross-sectional surface corresponding to FIG. 3. FIG. 15 and FIG. 18 to FIG. 21 are schematic cross-sectional views for describing the manufacturing method, and illustrate a cross-sectional surface corresponding to FIG. 7. FIG. 22 and FIG. 24 are schematic plan views for describing the manufacturing method, and illustrate a planar surface corresponding to FIG. 5. FIG. 23 is a schematic cross-sectional view for describing the manufacturing method, and illustrates a cross-sectional surface corresponding to FIG. 6.

Figure 8:
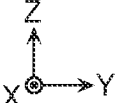
FIG. 8 is a schematic cross-sectional view for describing a manufacturing method of the semiconductor memory device according to the first embodiment.

In manufacturing the semiconductor memory device according to this embodiment, as illustrated in FIG. 8, for example, the insulating layer 101 is formed above a semiconductor substrate (not illustrated in FIG. 8). Next, a semiconductor layer 112A of silicon or the like, a sacrifice layer 112B of silicon oxide or the like, a sacrifice layer 112C of silicon or the like, a sacrifice layer 112D of silicon oxide or the like, and a semiconductor layer 112E of silicon or the like are formed on the insulating layer 101. Also, the plurality of insulating layers 101 and a plurality of sacrifice layers 110A are alternately formed. In addition, a part of the insulating layer 102 is formed. This process is performed by a method, such as Chemical Vapor Deposition (CVD).

Figure 9:
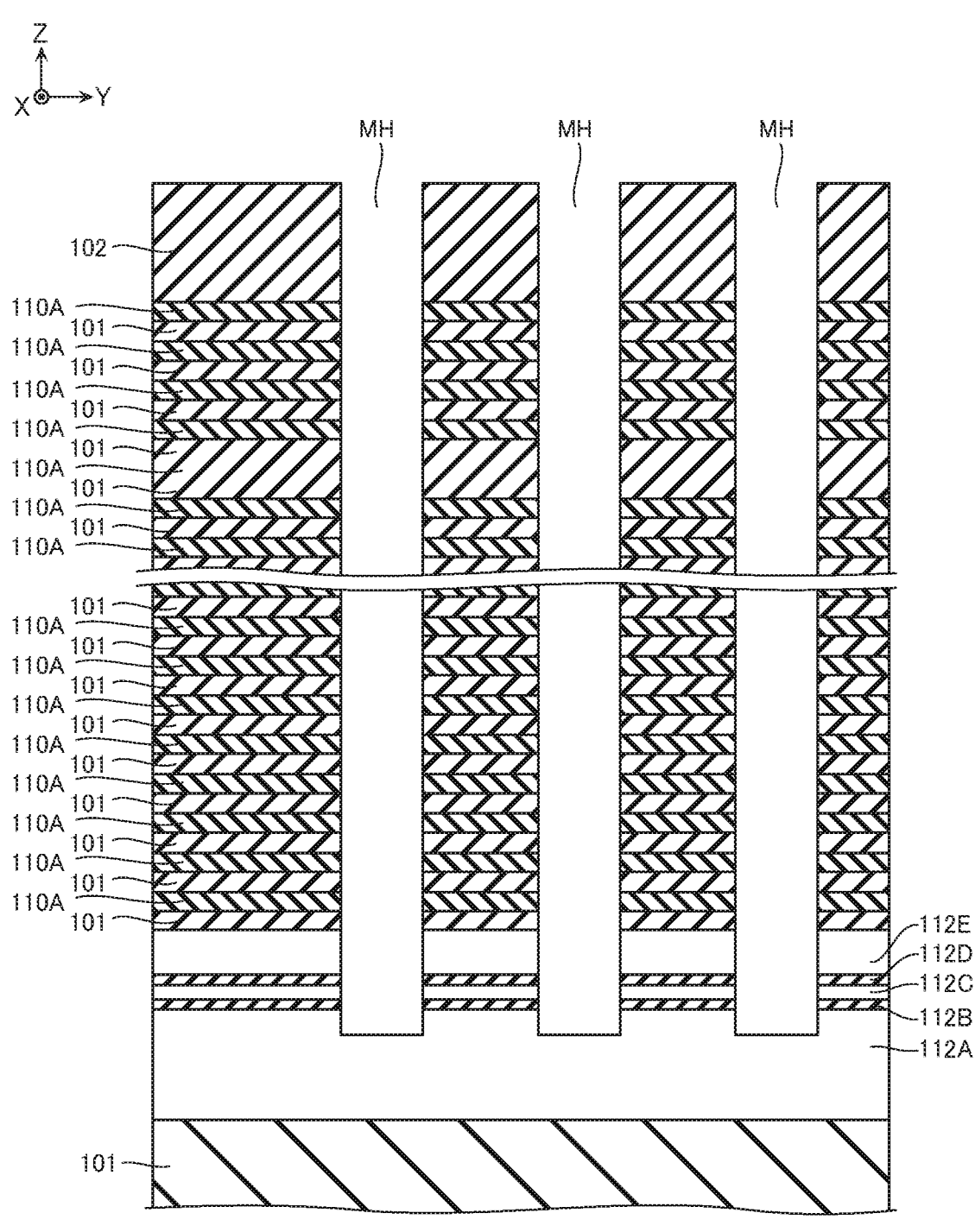
FIG. 9 is a schematic cross-sectional view for describing the manufacturing method.

Next, as illustrated in FIG. 9, for example, memory holes MH are formed in positions corresponding to the semiconductor columns 120. The memory holes MH extend in the Z-direction, penetrate the insulating layer 102, the insulating layers 101, the sacrifice layers 110A, the semiconductor layer 112E, the sacrifice layer 112D, the sacrifice layer 112C, and the sacrifice layer 112B, and expose an upper surface of the semiconductor layer 112A. This process is performed by a method, such as RIE.

Figure 10:
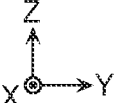
FIG. 10 is a schematic cross-sectional view for describing the manufacturing method.
Figure 10:
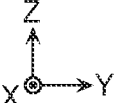

Next, as illustrated in FIG. 10, for example, the gate insulating films 130, the semiconductor columns 120, and the insulating columns 127 are formed inside the memory holes MH. This process is performed by a method, such as CVD.

Figure 11:
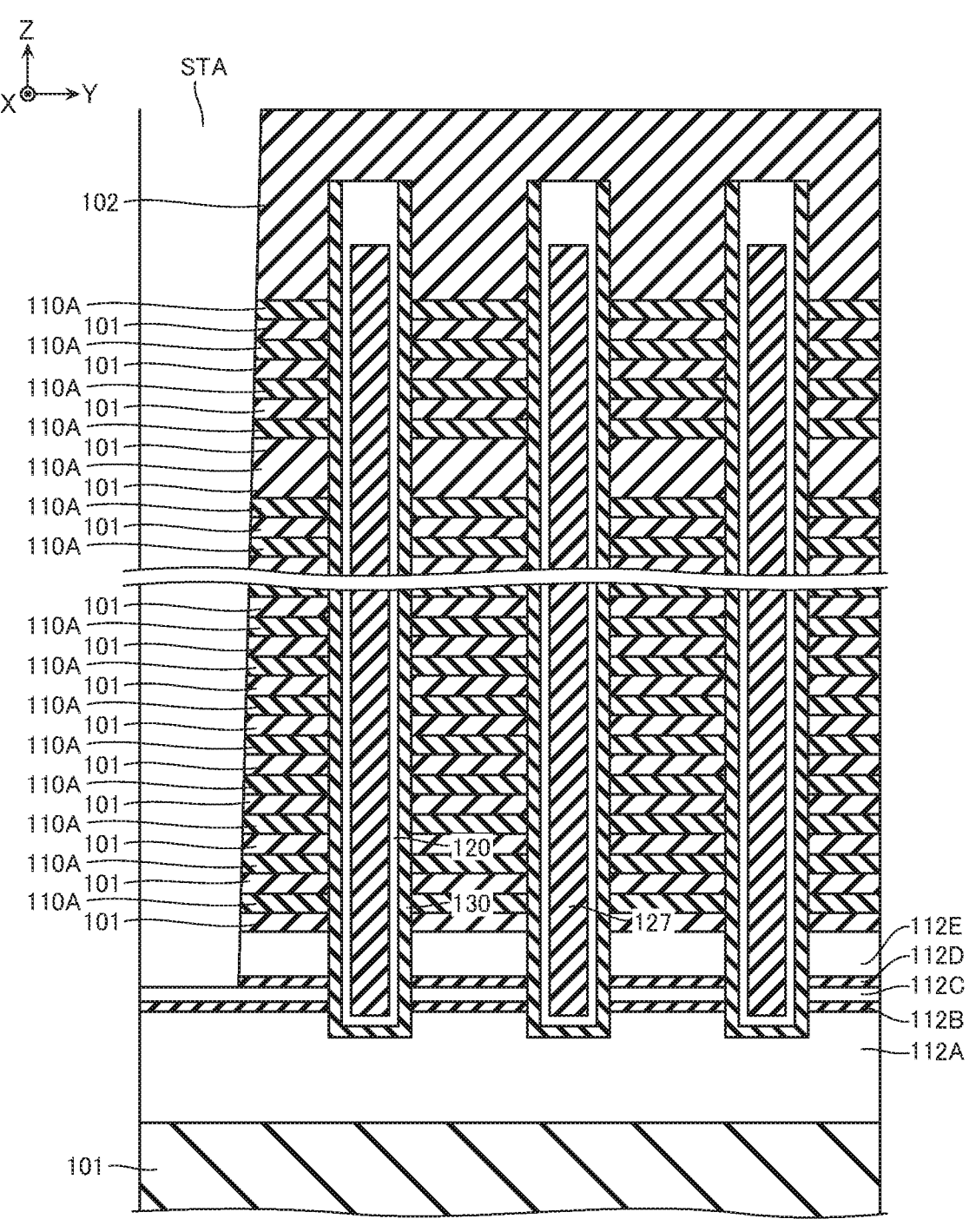
FIG. 11 is a schematic cross-sectional view for describing the manufacturing method.

Next, as illustrated in FIG. 11, a part of the insulating layer 102 is formed for example by a method, such as CVD. Also, a trench STA is formed in a position corresponding to the inter-finger structure ST. The trench STA extends in the Z-direction and X-direction, separates the insulating layer 102, the insulating layers 101, the sacrifice layers 110A, the semiconductor layer 112E, and the sacrifice layer 112D in the Y-direction, and exposes an upper surface of the sacrifice layer 112C. This process is performed by a method, such as RIE.

Figure 12:
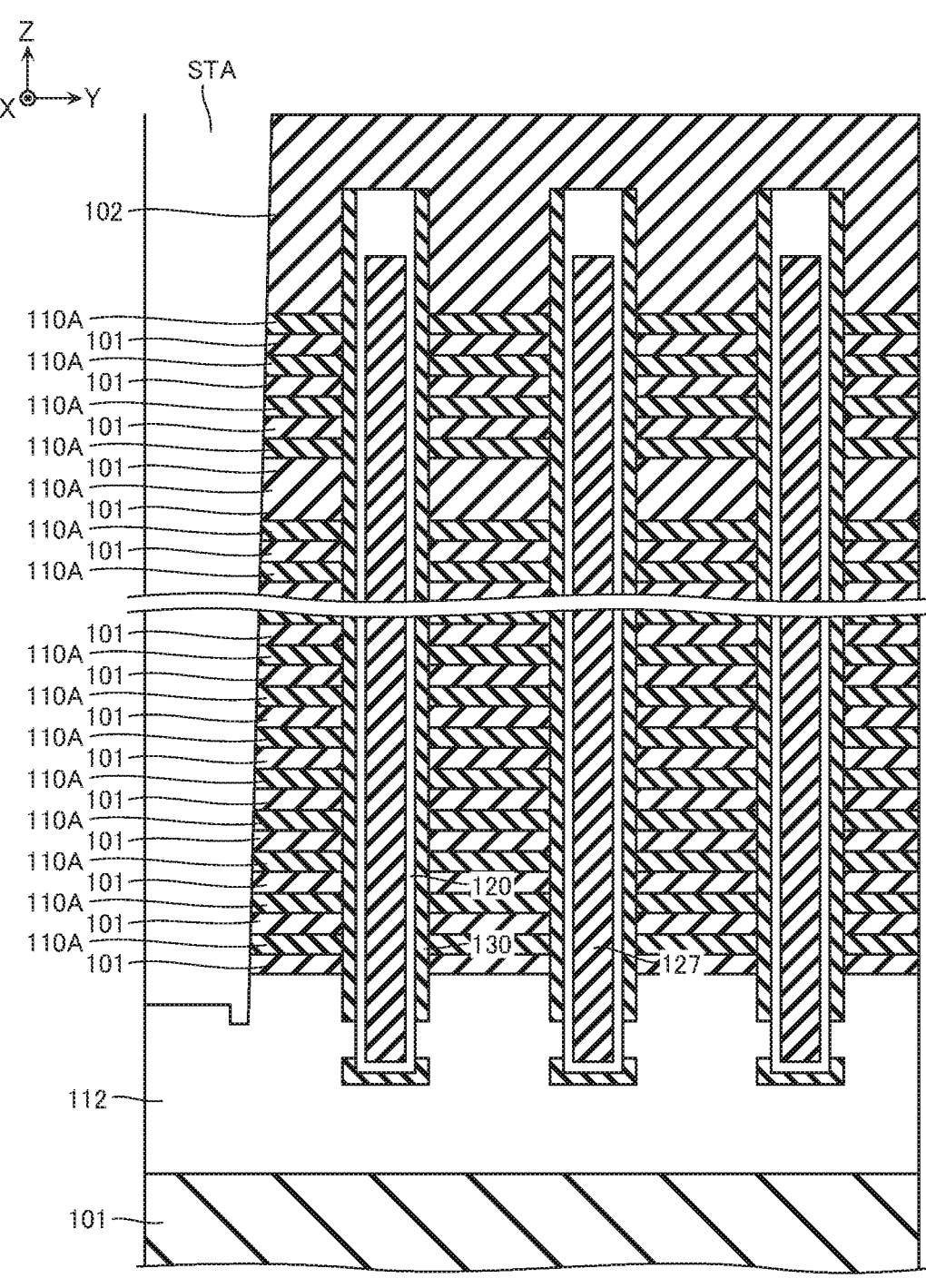
FIG. 12 is a schematic cross-sectional view for describing the manufacturing method.

Next, as illustrated in FIG. 12, for example, the sacrifice layer 112B, the sacrifice layer 112C, the sacrifice layer 112D, and parts of the gate insulating films 130 are removed to form the conductive layer 112. The removal of the sacrifice layer 112B, the sacrifice layer 112C, the sacrifice layer 112D, and the parts of the gate insulating films 130 is performed by a method, such as wet etching. The forming of the conductive layer 112 is performed by a method, such as epitaxial growth.

Figure 13:
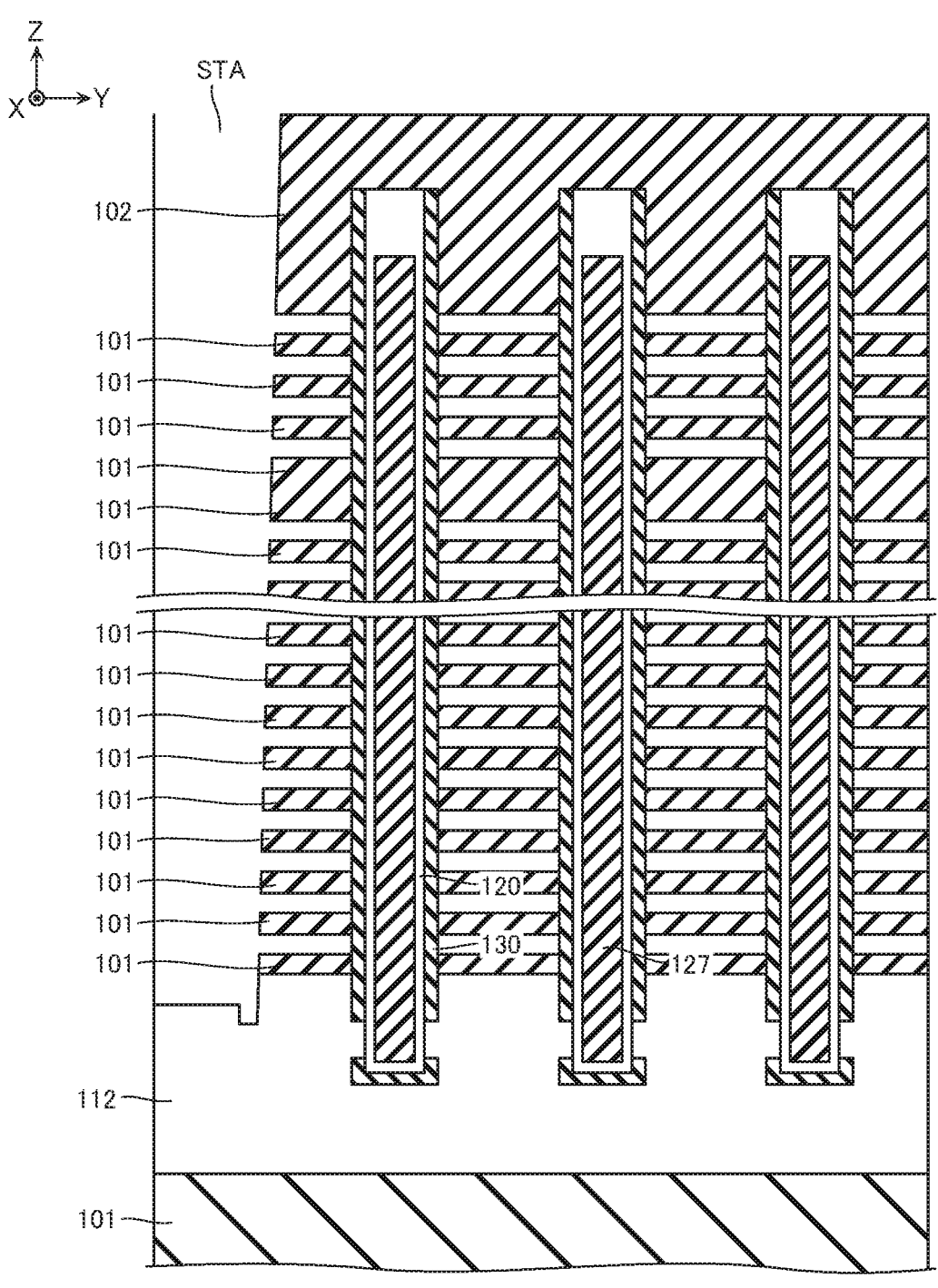
FIG. 13 is a schematic cross-sectional view for describing the manufacturing method.

Next, as illustrated in FIG. 13, for example, the sacrifice layers 110A are removed via the trench STA. Accordingly, a hollow structure including the plurality of insulating layers 101 and the insulating layer 102 that are arranged in the Z-direction, and structures in the memory holes MH (the semiconductor columns 120, the gate insulating films 130, and the insulating columns 127) supporting the insulating layers 101 and the insulating layer 102 are formed. This process is performed by a method, such as wet etching.

Figure 14:
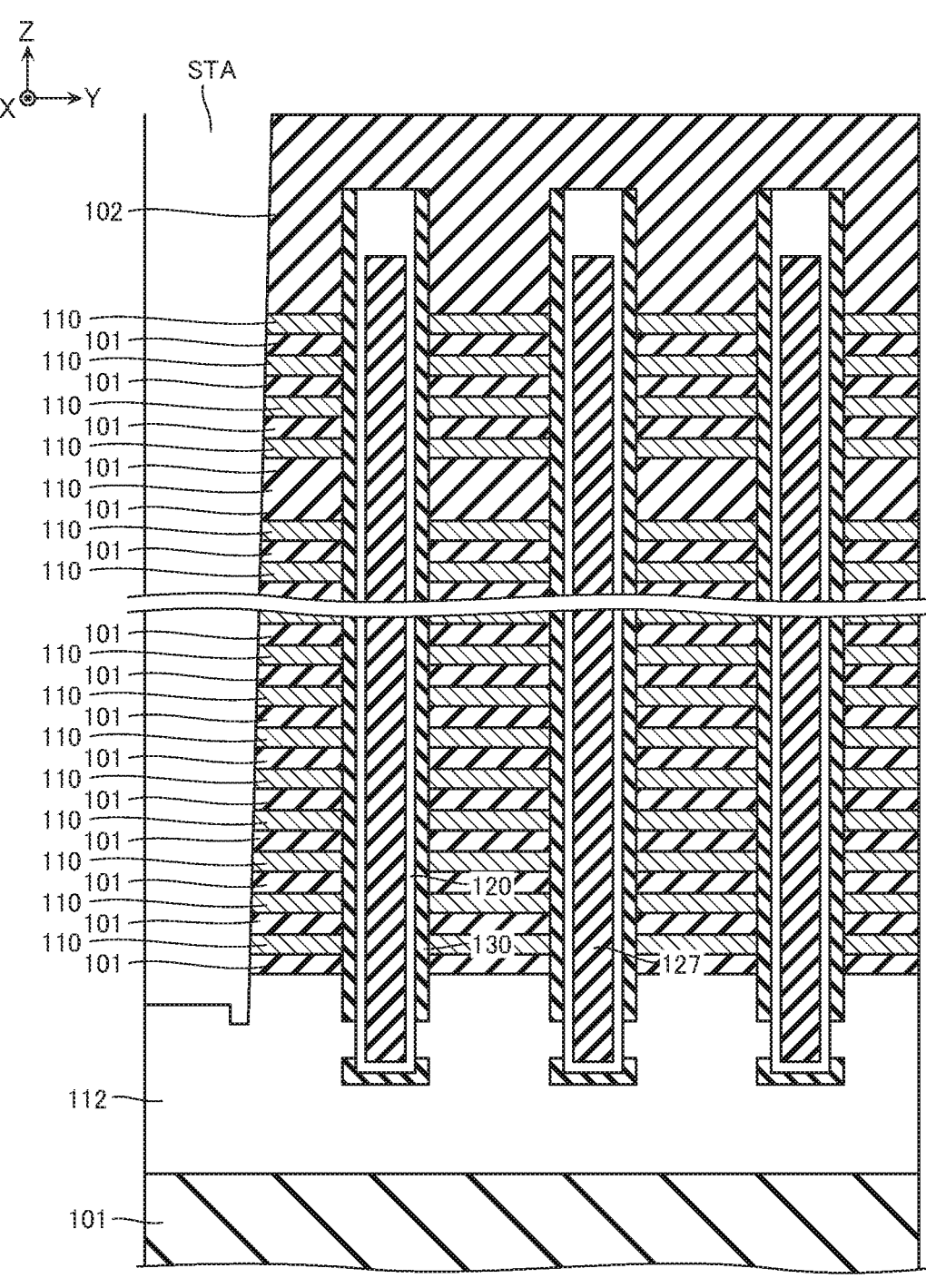
FIG. 14 is a schematic cross-sectional view for describing the manufacturing method.

Next, as illustrated in FIG. 14, for example, the wiring layers 110 are formed in spaces generated by removing the sacrifice layers 110A. This process is performed by a method, such as CVD.

Figure 15:
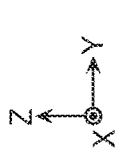
FIG. 15 is a schematic cross-sectional view for describing the manufacturing method.

Note that, in this process, as illustrated in FIG. 4, the metal oxide films 103, the barrier conductive films 113, the metal films 114, and the voids V are formed inside the wiring layers 110 (WL) and the like. Also, as illustrated in FIG. 15, the metal oxide films 103, the barrier conductive films 115, the metal films 116, and the voids V are formed inside the wiring layers 110 (SGD) and the like.

Figure 16:
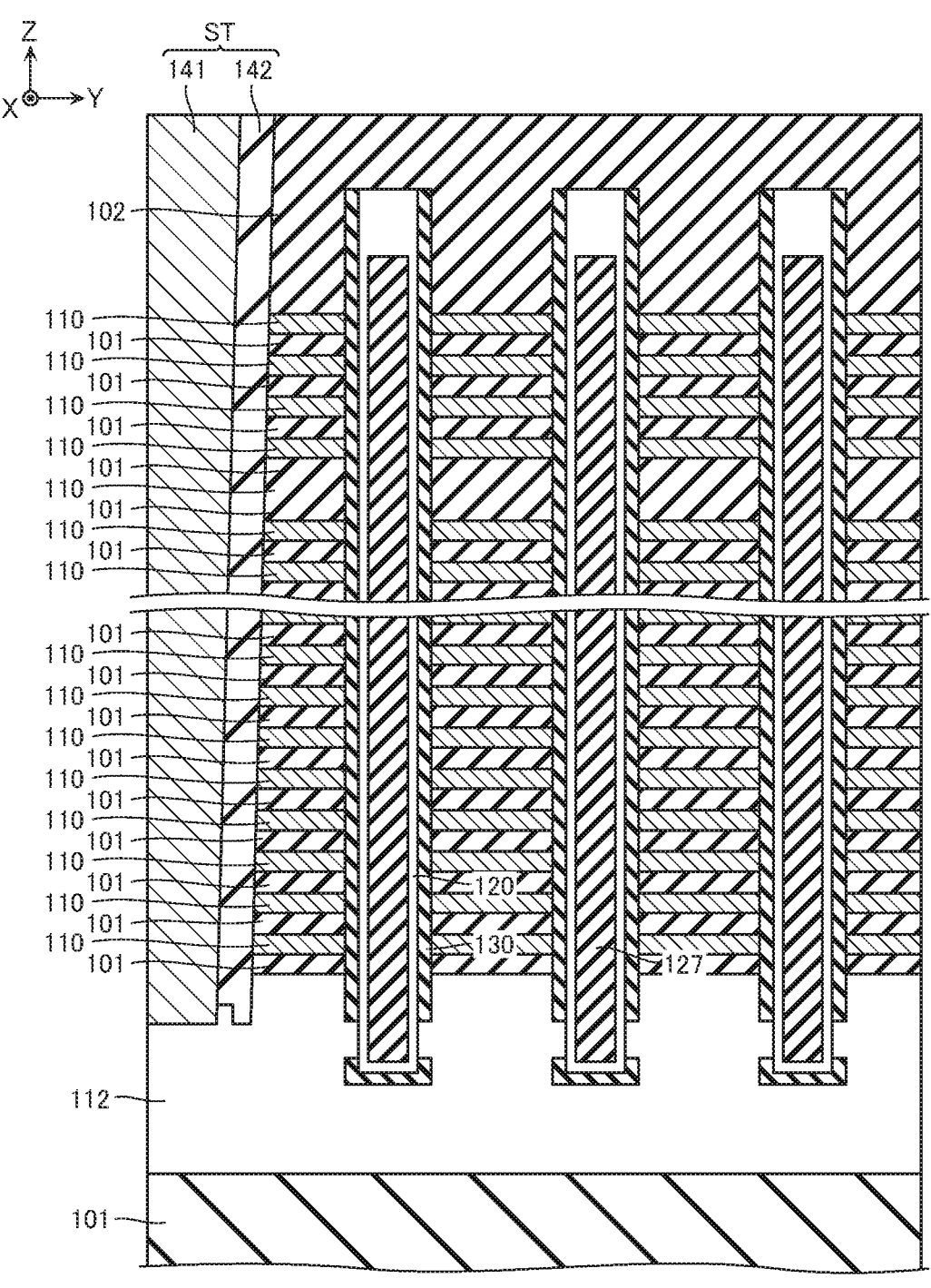
FIG. 16 is a schematic cross-sectional view for describing the manufacturing method.

Next, as illustrated in FIG. 16, for example, the inter-finger structure ST is formed in the trench STA. This process is performed by a method, such as CVD and RIE.

Figure 17:
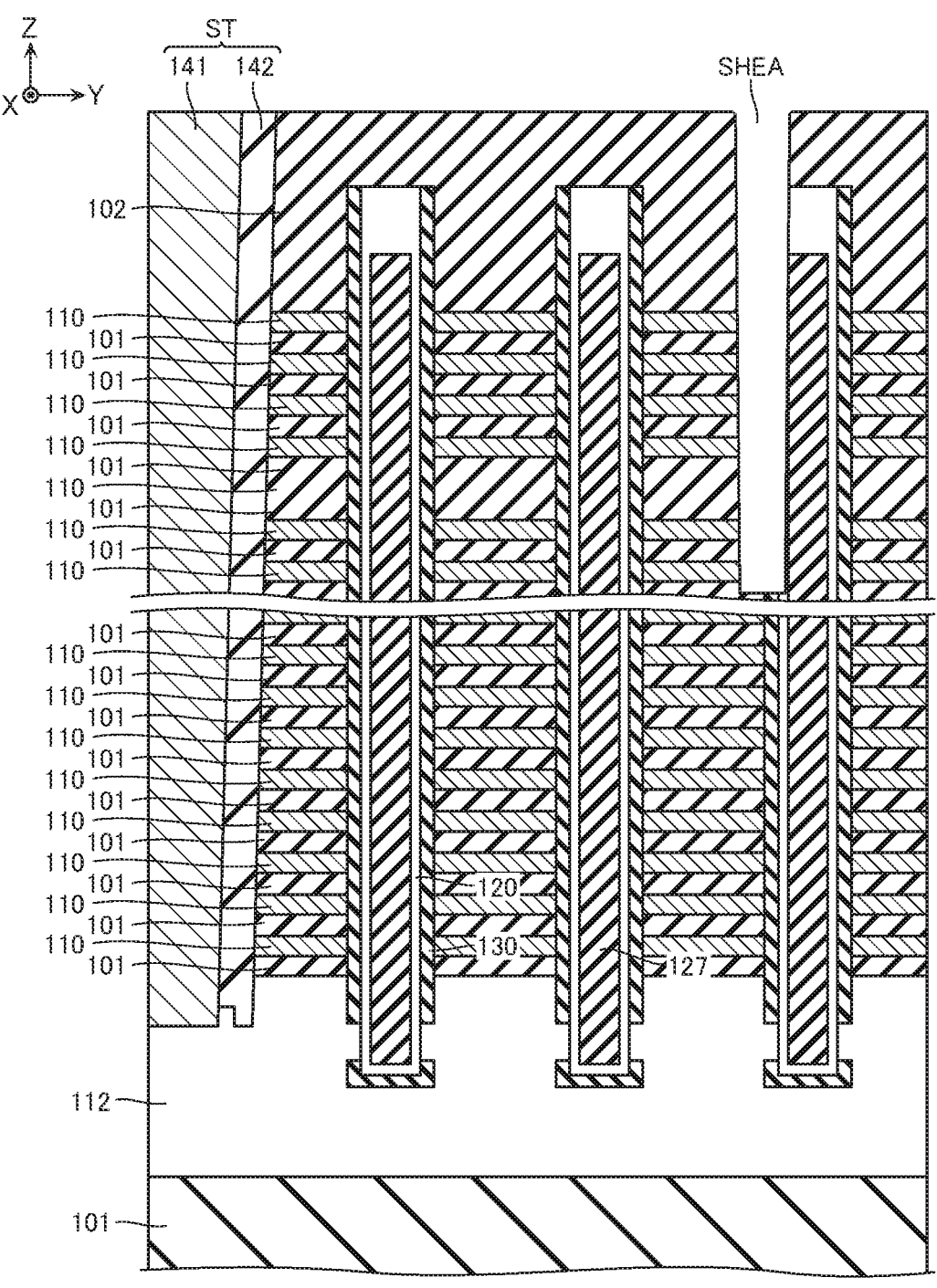
FIG. 17 is a schematic cross-sectional view for describing the manufacturing method.

Next, as illustrated in FIG. 17, for example, a trench SHEA is formed in a position corresponding to the inter-string unit insulating member SHE. The trench SHEA extends in the Z-direction and X-direction, and separates the insulating layer 102, the wiring layers 110 (SGD), a part of the wiring layers 110 (DWD), and the insulating layers 101 disposed between the wiring layers 110 in the Y-direction. This process is performed by a method, such as RIE.

Figure 18:
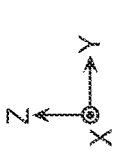
FIG. 18 is a schematic cross-sectional view for describing the manufacturing method.

Note that, in this process, as illustrated in FIG. 18, for example, the voids V in the wiring layers 110 (SGD) and the like communicate with the trench SHEA. Also, in this process, a part of the region 123 of the semiconductor column $120_o$ and parts of respective configurations formed in the region RCH on the outer peripheral surface of the semiconductor column $120_o$ (the tunnel insulating films 131, the electric charge accumulating films 132, and the block insulating films 133 in the gate insulating films 130, the metal oxide films 103, the barrier conductive films 115, and the metal films 116) are removed. Accordingly, the region 123 of the semiconductor column $120_o$ and the respective configurations formed in the region RCH on the outer peripheral surface of the semiconductor column $120_o$ are formed in shapes in which a part of cylinder is missing (arc-like shape in an XY cross-sectional surface) as described with reference to FIG. 5.

Figure 19:
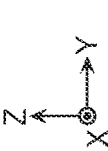
FIG. 19 is a schematic cross-sectional view for describing the manufacturing method.

Next, as illustrated in FIG. 19, for example, on both side surfaces in the Y-direction of the trench SHEA and inside the voids V, the barrier conductive films 117 and the metal films 118 are formed. This process is performed by a method, such as CVD. In the illustrated example, the barrier conductive film 117 has a relatively good embeddability. Therefore, the barrier conductive film 117 is formed on a bottom surface, an upper surface, and a side surface of the void V. On the other hand, the embeddability of the metal film 118 is not as good as that of the barrier conductive film 117. Therefore, the metal film 118 is formed only in a region in the proximity of the trench SHEA in the void V. That is, by this process, a part communicating with the trench SHEA of the void V is obstructed by the metal film 118, and the void V and the trench SHEA are spatially separated.

Figure 20:
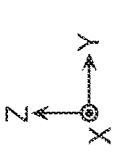
FIG. 20 is a schematic cross-sectional view for describing the manufacturing method.

Next, as illustrated in FIG. 20, for example, in the barrier conductive films 117 and the metal films 118, the parts formed on both side surfaces in the Y-direction of the trench SHEA are removed. This process is performed by a method, such as wet etching.

Figure 21:
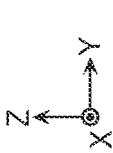
FIG. 21 is a schematic cross-sectional view for describing the manufacturing method.
Figure 22:
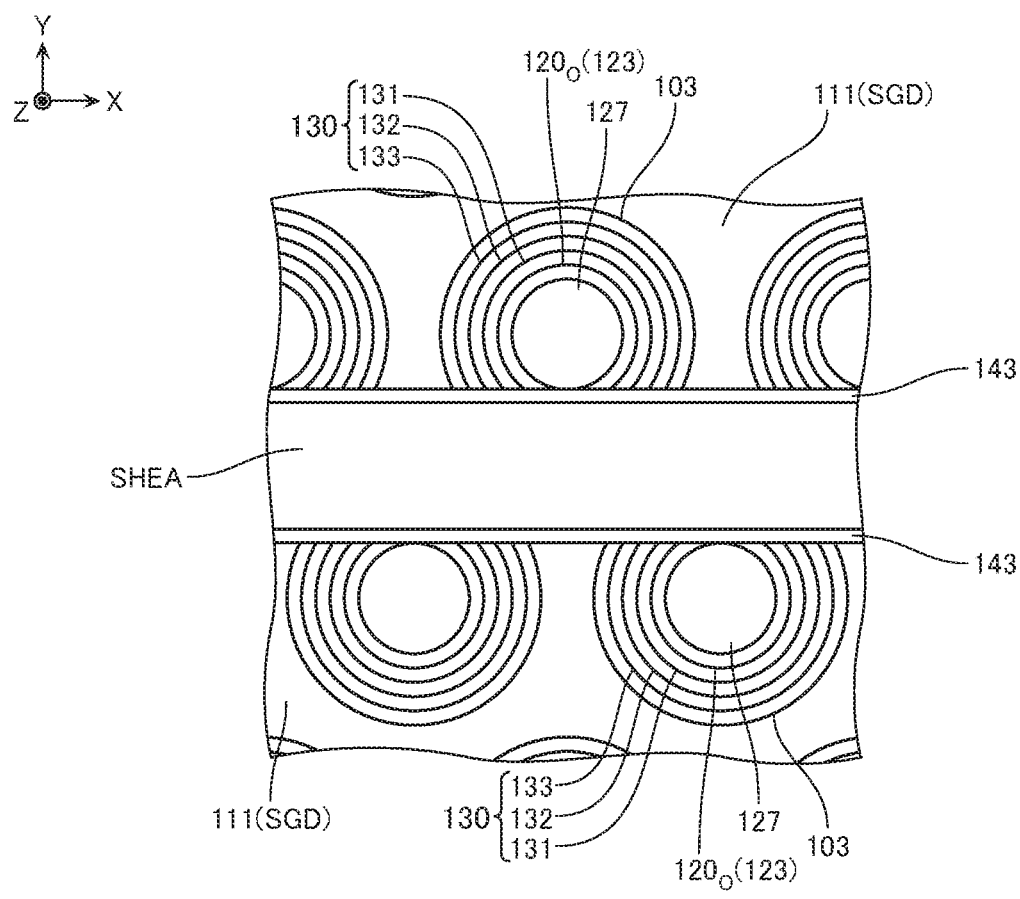
FIG. 22 is a schematic plan view for describing the manufacturing method.

Next, as illustrated in FIG. 21 and FIG. 22, for example, on both side surfaces in the Y-direction of the trench SHEA, insulating members 143 of silicon oxide ($SiO_2$) or the like are formed. This process is performed by a method, such as CVD.

Next, as illustrated in FIG. 23 and FIG. 24, an oxidation process is performed on the electric charge accumulating film 132 disposed at a position corresponding to the region 123 in the semiconductor column $120_o$ via the trench SHEA. Accordingly, on contact surfaces in contact with the insulating members 143 of the electric charge accumulating film 132, the insulating members 134 (FIG. 24) are formed. Also, the insulating members 128 are formed on contact surfaces in contact with the insulating members 143 of the semiconductor column 120o.

Subsequently, by forming the inter-string unit insulating member SHE inside the trench SHEA, and forming the via-contact electrodes Ch, Vy and the bit lines BL, a structure as described with reference to FIG. 3 is formed.

Effect

As described with reference to FIG. 2 and the like, in the semiconductor memory device according to the first embodiment, the two wirings 111 (SGD) mutually adjacent in the Y-direction are electrically insulated by the inter-string unit insulating member SHE. Here, in the semiconductor memory device according to the first embodiment, the inter-string unit insulating member SHE is disposed between the 4n-th semiconductor column row SC and the 4n+1-th semiconductor column row SC counted from one side in the Y-direction.

With such configuration, the semiconductor columns 120 in all the semiconductor column rows SC can be used as a memory cell and the like (a memory string in which memory cells, dummy cells, and select transistor are connected in series). Accordingly, for example, compared with a structure in which a part of the plurality of the semiconductor columns 120 disposed at positions overlapping with the inter-string unit insulating member SHE are dummies and not used as a memory cell or the like, high integration of the semiconductor memory device can be achieved.

Here, in the first embodiment, basically the semiconductor column 120 and the respective configurations formed in its outer peripheral surface are formed in an approximately cylindrical shape. However, as described with reference to FIG. 5 and the like, the region 123 of the semiconductor column $120_o$ and the respective configurations formed in the region RCH in the outer peripheral surface of the semiconductor column $120_o$ have a shape in which a part of cylinder is missing. Therefore, the select transistor corresponding to the semiconductor column $120_I$ and the select transistor corresponding to the semiconductor column $120_o$ might have a different threshold voltage. Therefore, in such configuration, it is desirable to adjust an electric charge amount in the electric charge accumulating film 132 in advance, and thereby perform adjustment of the threshold voltage in the select transistor or the like.

Specifically, in order to preferably perform the adjustment of the threshold voltage of the select transistor or the like, it is desirable to perform an oxidation process on a region in the proximity of the inter-string unit insulating member SHE of the electric charge accumulating film 132. This is because, it is considered that since a moving range of the electrons is narrowed due to oxidation of a part of the electric charge accumulating film 132, the electrons moving to a range where an electric field from the wiring 111 (SGD) is difficult to reach (for example, a range at the inter-string unit insulating member SHE side with respect to the imaginary lines L1, L2 in FIG. 5) is avoided.

Here, for example, in the process described with reference to FIG. 17 and FIG. 18, the trench SHEA is formed and thereby parts of the electric charge accumulating films 132 are exposed to the trench SHEA. Accordingly, it can also be considered to perform the oxidation process on the parts of the electric charge accumulating film 132 after executing this process. However, by performing the oxidation process in a state where the metal film 116 (FIG. 18) is exposed inside the trench SHEA, an abnormal oxidation might occur, and the structure being manufactured might be broken.

In order to reduce the abnormal oxidation and perform the oxidation process on a part of the electric charge accumulating film 132, for example, it is assumed to execute the process described with reference to FIG. 17 and FIG. 18, then form the insulating member 143 described with reference to FIG. 21 and FIG. 22 on side surfaces of the trench SHEA, and oxidize the electric charge accumulating film 132 via the insulating member 143. However, since the trench SHEA and the voids V inside the wiring layers 110 (SGD) communicate in the structure as illustrated in FIG. 18, depending on the embeddability of the insulating member 143 (FIG. 21), the upper surface and the bottom surface of the void V cannot be covered by the insulating member 143, and there is a possibility that the abnormal oxidation cannot be reduced.

Therefore, in the first embodiment, in the processes described with reference to FIG. 19 and FIG. 20, the barrier conductive film 117 and the metal film 118 are formed in a region in the proximity of the trench SHEA of the wiring layer 110 (SGD), and thereby obstructing the void V. Also, in the process described with reference to FIG. 21 and FIG. 22, the insulating members 143 are formed on both side surfaces of the trench SHEA, and the oxidation process is performed in the process described with reference to FIG. 23 and FIG. 24.

According to such method, by obstructing the voids V in the processes described with reference to FIG. 19 and FIG. 20, and making the surface exposed to the trench SHEA of the wiring 111 (SGD) be a surface that is continuous in the Z-direction, it becomes possible to preferably cover side surfaces of the wirings 111 (SGD) by the insulating members 143 in the process described with reference to FIG. 21. Accordingly, it becomes possible to reduce the abnormal oxidation of the metal film 116 or the like, while performing the oxidation process on part of the electric charge accumulating films 132.

In addition, in the first embodiment, in the processes described with reference to FIG. 19 and FIG. 20, the barrier conductive film 117 is formed before the metal film 118 is formed. Here, in the case where the metal film 118 contains tungsten (W), the forming of the metal film 118 can use gas, such as tungsten hexafluoride ($WF_6$). By using such gas to form a tungsten film on the insulating layer 101 of silicon oxide ($SiO_2$) or the like, there is a concern that a part of insulating layer 101 might be removed by an influence of fluorine (F) remaining in the tungsten, and might become a cause of short-circuit between two wirings 111 arranged in the Z-direction. In this embodiment, by forming the barrier conductive film 117, it is possible to reduce the occurrence of such short-circuit.

Other Embodiments

The semiconductor memory device according to the first embodiment has been described above. However, such configuration is merely an example, and specific configurations are appropriately adjustable.

For example, in the first embodiment, in the process described with reference to FIG. 14 and FIG. 15, the metal oxide film 103 is formed in each wiring layer 110. However, the metal oxide film 103 may be formed in the memory hole MH in the process described with reference to FIG. 10. Accordingly, the metal oxide film 103 may be formed along an outer peripheral surface of the gate insulating film 130. Also, the metal oxide film 103 need not be formed on the upper and lower surfaces of the wirings 111.

In addition, as described with reference to FIG. 4, the wiring 111 (WL) or the like includes the barrier conductive film 113. Also, as described with reference to FIG. 7, the wiring 111 (SGD) or the like includes the barrier conductive films 115, 117. However, the wiring 111 (WL) or the like need not include the barrier conductive film 113. Similarly, the wiring 111 (SGD) or the like need not include the barrier conductive films 115, 117.

Others

While certain embodiments have been described, these embodiments have been presented by way of example only, and are not intended to limit the scope of the inventions. Indeed, the novel devices and methods described herein may be embodied in a variety of other forms: furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of wiring layers stacked in a stacking direction;
a semiconductor column extending in the stacking direction, and opposed to the plurality of wiring layers;
a gate insulating film disposed between the plurality of wiring layers and the semiconductor column, and including an electric charge accumulating film; and
an insulating member extending in the stacking direction in a range in the stacking direction corresponding to a part of the plurality of wiring layers, having a surface on one side in a first direction intersecting with the stacking direction in contact with the gate insulating film, and having a surface on the other side in the first direction separated from the gate insulating film, wherein
a first wiring layer included in the part of the plurality of wiring layers includes:
a first wiring disposed on a gate insulating film side in the first direction with respect to the insulating member and opposed to the semiconductor column via the gate insulating film;
a second wiring disposed on a side opposite to the gate insulating film in the first direction with respect to the insulating member and in contact with the insulating member;
a first metal oxide film covering a surface on one side and a surface on the other side in the stacking direction and an opposed surface to the semiconductor column of the first wiring; and
a second metal oxide film covering a surface on one side and a surface on the other side in the stacking direction and not covering a contact surface with the insulating member of the second wiring,
compared with an end portion on an insulating member side in the first direction of the first metal oxide film included in the first wiring layer, an end portion on the insulating member side in the first direction of the electric charge accumulating film at a position in the stacking direction corresponding to the first metal oxide film has a larger distance in the first direction from the insulating member, and
the second wiring includes:
a first conductive layer and a second conductive layer spaced apart in the stacking direction; and
a first conductive portion connected to end portions on the insulating member side in the first direction of the first conductive layer and the second conductive layer, and including the contact surface with the insulating member continuously in the stacking direction.

2. The semiconductor memory device according to claim 1, wherein
the insulating member is disposed in a position overlapping with a part of the gate insulating film viewed from the stacking direction.

3. The semiconductor memory device according to claim 1, wherein
the insulating member is disposed in a position overlapping with a part of the electric charge accumulating film viewed from the stacking direction.

4. The semiconductor memory device according to claim 1, wherein in a first cross-sectional surface extending in the first direction and a second direction intersecting with the stacking direction and the first direction, and including the first wiring layer, the electric charge accumulating film includes:

a first region disposed on one side in the second direction with respect to a center position in the second direction of the semiconductor column; and a second region disposed on the other side in the second direction with respect to the center position in the second direction of the semiconductor column, and a first end portion on the insulating member side in the first direction of the first region, and a second end portion on the insulating member side in the first direction of the second region are separated in the second direction.

5. The semiconductor memory device according to claim 4, wherein the first wiring includes:

a first contact surface disposed on the one side in the second direction with respect to the center position in the second direction of the semiconductor column, connected to the opposed surface to the semiconductor column of the first wiring, and in contact with the insulating member; and a second contact surface disposed on the other side in the second direction with respect to the center position in the second direction of the semiconductor column, connected to the opposed surface to the semiconductor column of the first wiring, and in contact with the insulating member, and in the first cross-sectional surface;

the first end portion is disposed on a side opposite to the insulating member with respect to a first imaginary line connecting an end portion on a second contact surface side in the second direction of the first contact surface and a center of a circumscribed circle of the semiconductor column; and the second end portion is disposed on a side opposite to the insulating member with respect to a second imaginary line connecting an end portion on a first contact surface side in the second direction of the second contact surface and the center of the circumscribed circle of the semiconductor column.

6. The semiconductor memory device according to claim 1, wherein an end portion on the insulating member side in the first direction of the semiconductor column at the position in the stacking direction corresponding to the first metal oxide film has a larger distance in the first direction from the insulating member compared with the end portion on the insulating member side in the first direction of the first metal oxide film.

7. The semiconductor memory device according to claim 6, wherein in a first cross-sectional surface extending in the first direction and a second direction intersecting with the stacking direction and the first direction, and including the first wiring layer, the semiconductor column includes:

a third region disposed on one side in the second direction with respect to a center position in the second direction of the semiconductor column; and a fourth region disposed on the other side in the second direction with respect to the center position in the second direction of the semiconductor column, and an end portion on the insulating member side in the first direction of the third region, and an end portion on the insulating member side in the first direction of the fourth region are separated in the second direction.

8. The semiconductor memory device according to claim 1, wherein a first void is disposed between the first conductive layer and the second conductive layer.

9. The semiconductor memory device according to claim 8, wherein the second wiring includes:

a first barrier conductive film disposed on a surface on a first void side of the second metal oxide film;

a first metal film disposed on a surface on the first void side of the first barrier conductive film;

a second barrier conductive film disposed on a surface on the first void side of the first metal film; and a second metal film disposed on surfaces different from an exposed surface to the first void of the second barrier conductive film, the first conductive layer and the second conductive layer each include parts of the first barrier conductive film, the first metal film, and the second barrier conductive film, and the first conductive portion includes the other parts of the first barrier conductive film, the first metal film, and the second barrier conductive film, and the second metal film.

10. The semiconductor memory device according to claim 9, wherein the second metal film is in contact with the insulating member.

11. The semiconductor memory device according to claim 8, wherein a distance in the first direction of the first conductive portion from the first void to the contact surface with the insulating member of the second wiring is larger than a length in the stacking direction of the first conductive layer and a length in the stacking direction of the second conductive layer.

12. The semiconductor memory device according to claim 1, wherein the first wiring includes:

a third conductive layer and a fourth conductive layer spaced apart in the stacking direction; and a second conductive portion connected to the third conductive layer and the fourth conductive layer, and including the opposed surface to the semiconductor column continuously in the stacking direction, the first conductive layer and the third conductive layer are arranged in the first direction, and the second conductive layer and the fourth conductive layer are arranged in the first direction.

13. The semiconductor memory device according to claim 12, wherein a second void is disposed between the third conductive layer and the fourth conductive layer.

14. The semiconductor memory device according to claim 13, wherein the first wiring includes:

a third barrier conductive film disposed on a surface on a second void side of the first metal oxide film;

a third metal film disposed on a surface on the second void side of the third barrier conductive film; and a fourth barrier conductive film disposed on a surface on the second void side of the third metal film, and the third conductive layer, the fourth conductive layer, and the second conductive portion each include parts of the third barrier conductive film, the third metal film, and the fourth barrier conductive film.

15. The semiconductor memory device according to claim 12, wherein a first void is disposed between the first conductive layer and the second conductive layer, a second void is disposed between the third conductive layer and the fourth conductive layer, and a distance in the first direction of the first conductive portion from the first void to the contact surface with the insulating member of the second wiring is larger than a distance in the first direction of the second conductive portion from the second void to the opposed surface to the semiconductor column of the first wiring.

16. A semiconductor memory device comprising:

a plurality of wiring layers stacked in a stacking direction;

a semiconductor column extending in the stacking direction, and opposed to the plurality of wiring layers;

a gate insulating film disposed between the plurality of wiring layers and the semiconductor column, and including an electric charge accumulating film; and an insulating member extending in the stacking direction in a range in the stacking direction corresponding to a part of the plurality of wiring layers, having a surface on one side in a first direction intersecting with the stacking direction in contact with the gate insulating film, and having a surface on the other side in the first direction separated from the gate insulating film, wherein a first wiring layer included in the part of the plurality of wiring layers includes:

a first wiring disposed on a gate insulating film side in the first direction with respect to the insulating member and opposed to the semiconductor column via the gate insulating film; and a second wiring disposed on a side opposite to the gate insulating film in the first direction with respect to the insulating member and in contact with the insulating member, a first metal oxide film is disposed on an opposed surface to the semiconductor column of the first wiring, at a position in the stacking direction corresponding to the first wiring layer, an end portion on an insulating member side in the first direction of the electric charge accumulating film has a larger distance in the first direction from the insulating member compared with an end portion on the insulating member side in the first direction of the first metal oxide film, the second wiring includes:

a first conductive layer and a second conductive layer spaced apart in the stacking direction; and a first conductive portion connected to end portions on the insulating member side in the first direction of the first conductive layer and the second conductive layer, and including a contact surface with the insulating member continuously in the stacking direction, a first void is disposed between the first conductive layer and the second conductive layer, and a distance in the first direction of the first conductive portion from the first void to a contact surface with the insulating member of the second wiring is larger than a length in the stacking direction of the first conductive layer and a length in the stacking direction of the second conductive layer.

17. The semiconductor memory device according to claim 16, wherein the second wiring includes:

a first barrier conductive film including a portion disposed on one side in the stacking direction with respect to the first void, and a portion disposed on the other side in the stacking direction with respect to the first void;

a first metal film disposed on a surface on a first void side of the first barrier conductive film;

a second barrier conductive film disposed on a surface on the first void side of the first metal film; and a second metal film disposed on surfaces different from an exposed surface to the first void of the second barrier conductive film, the first conductive layer and the second conductive layer each include parts of the first barrier conductive film, the first metal film, and the second barrier conductive film, and the first conductive portion includes the other parts of the first barrier conductive film, the first metal film, and the second barrier conductive film, and the second metal film.

18. The semiconductor memory device according to claim 17, wherein the second metal film is in contact with the insulating member.

19. The semiconductor memory device according to claim 16, wherein the first wiring includes:

a third conductive layer and a fourth conductive layer spaced apart in the stacking direction; and a second conductive portion connected to the third conductive layer and the fourth conductive layer, and including the opposed surface to the semiconductor column continuously in the stacking direction, the first conductive layer and the third conductive layer are arranged in the first direction, and the second conductive layer and the fourth conductive layer are arranged in the first direction.

20. The semiconductor memory device according to claim 19, wherein a second void is disposed between the third conductive layer and the fourth conductive layer, and the distance in the first direction of the first conductive portion from the first void to the contact surface with the insulating member of the second wiring is larger than a distance in the first direction of the second conductive portion from the second void to the opposed surface to the semiconductor column of the first wiring.

* * * * *